United States Patent
Wang et al.

(10) Patent No.: US 12,483,225 B2
(45) Date of Patent: Nov. 25, 2025

(54) BULK ACOUSTIC WAVE RESONATOR WITH OXIDE RAISED FRAME

(71) Applicant: SKYWORKS GLOBAL PTE. LTD., Singapore (SG)

(72) Inventors: Yiliu Wang, Irvine, CA (US); Kwang Jae Shin, Yongin (KR); Jae Hyung Lee, Seoul (KR); Jong Duk Han, Yongin (KR)

(73) Assignee: SKYWORKS GLOBAL PTE. LTD., Singapore (SG)

( * ) Notice: Subject to any disclaimer, the term of this patent is extended or adjusted under 35 U.S.C. 154(b) by 439 days.

(21) Appl. No.: 17/662,686

(22) Filed: May 10, 2022

(65) Prior Publication Data

US 2022/0368312 A1  Nov. 17, 2022

Related U.S. Application Data

(60) Provisional application No. 63/188,734, filed on May 14, 2021.

(51) Int. Cl.
*H03H 9/60* (2006.01)
*H03H 9/02* (2006.01)
*H03H 9/205* (2006.01)

(52) U.S. Cl.
CPC ........ *H03H 9/605* (2013.01); *H03H 9/02086* (2013.01); *H03H 9/205* (2013.01)

(58) Field of Classification Search
CPC .... H03H 9/605; H03H 9/205; H03H 9/02086; H03H 9/02118; H03H 9/02157
(Continued)

(56) References Cited

U.S. PATENT DOCUMENTS

| 7,358,831 B2 | 4/2008 | Larson, III et al. |
| 9,385,303 B2 | 7/2016 | Song et al. |

(Continued)

FOREIGN PATENT DOCUMENTS

| CN | 111786645 A | 10/2020 |
| JP | 2002374144 A | 12/2002 |

(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Yuqing Xiao
*Assistant Examiner* — Christopher Richard Walker
(74) *Attorney, Agent, or Firm* — Lando & Anastasi, LLP

(57) ABSTRACT

A ladder filter comprises series arm bulk acoustic wave resonators electrically connected in series between an input port and an output port and shunt bulk acoustic wave resonators electrically connected between adjacent ones of the series arm bulk acoustic wave resonators and ground, each of the arm bulk acoustic resonators including a central active region and a raised frame region outside of the central active region, each of the series arm bulk acoustic resonators including a piezoelectric film, at least one of the series arm bulk acoustic wave resonators including a layer of oxide disposed directly on the piezoelectric film in the raised frame region, and a metal layer disposed directly on the piezoelectric film in the central active region and on the layer of oxide in the raised frame region, the metal layer having a thickness in the raised frame region no greater than in the central active region.

23 Claims, 24 Drawing Sheets

(58) Field of Classification Search
USPC .......................................................... 367/180
See application file for complete search history.

(56) References Cited

U.S. PATENT DOCUMENTS

| | | | |
|---|---|---|---|
| 9,401,692 | B2 | 7/2016 | Burak et al. |
| 9,425,764 | B2 | 8/2016 | Burak et al. |
| 9,444,426 | B2 | 9/2016 | Burak et al. |
| 9,484,882 | B2 | 11/2016 | Burak et al. |
| 9,490,771 | B2 | 11/2016 | Burak et al. |
| 9,853,626 | B2 | 12/2017 | Burak et al. |
| 9,991,871 | B2 | 6/2018 | Zou et al. |
| 10,284,173 | B2 | 5/2019 | Burak et al. |
| 10,367,472 | B2 | 7/2019 | Burak et al. |
| 10,404,231 | B2 | 9/2019 | Burak et al. |
| 10,608,611 | B2 * | 3/2020 | Tajic ................. H03H 9/02086 |
| 10,756,702 | B2 | 8/2020 | Lee et al. |
| 10,812,037 | B2 | 10/2020 | Kyoung et al. |
| 11,050,409 | B2 | 6/2021 | Park et al. |
| 11,082,023 | B2 | 8/2021 | Shin et al. |
| 11,190,164 | B2 | 11/2021 | Yen et al. |
| 11,482,985 | B2 | 10/2022 | Fries et al. |
| 11,502,667 | B2 * | 11/2022 | Tajic ................. H03H 9/02062 |
| 11,601,112 | B2 | 3/2023 | Wang et al. |
| 11,601,113 | B2 * | 3/2023 | Wang ..................... H03H 9/605 |
| 2007/0057599 | A1 | 3/2007 | Motai et al. |
| 2008/0024042 | A1 | 1/2008 | Isobe et al. |
| 2008/0174389 | A1 | 7/2008 | Mori et al. |
| 2009/0001848 | A1 | 1/2009 | Umeda et al. |
| 2010/0013573 | A1 | 1/2010 | Umeda |
| 2010/0019866 | A1 | 1/2010 | Hara et al. |
| 2011/0180391 | A1 | 7/2011 | Larson, III et al. |
| 2011/0304412 | A1 | 12/2011 | Zhang |
| 2012/0200195 | A1 | 8/2012 | Yokoyama et al. |
| 2013/0033337 | A1 | 2/2013 | Nishihara et al. |
| 2013/0063227 | A1 | 3/2013 | Burak et al. |
| 2013/0106248 | A1 | 5/2013 | Burak et al. |
| 2013/0140959 | A1 | 6/2013 | Shin et al. |
| 2013/0193809 | A1 | 8/2013 | Araki |
| 2014/0118091 | A1 | 5/2014 | Burak et al. |
| 2014/0118092 | A1 | 5/2014 | Burak et al. |
| 2014/0167566 | A1 | 6/2014 | Kando |
| 2014/0203684 | A1 | 7/2014 | Yamamoto et al. |
| 2014/0203686 | A1 | 7/2014 | Song et al. |
| 2014/0292150 | A1 | 10/2014 | Zou et al. |
| 2014/0339959 | A1 | 11/2014 | Lee et al. |
| 2015/0214923 | A1 | 7/2015 | Tsuzuki |
| 2016/0028371 | A1 | 1/2016 | Nishihara et al. |
| 2016/0118957 | A1 * | 4/2016 | Burak ................. H03H 9/02102 333/187 |
| 2016/0118958 | A1 | 4/2016 | Burak et al. |
| 2016/0164487 | A1 * | 6/2016 | Shin ....................... H03H 9/605 333/189 |
| 2017/0033769 | A1 | 2/2017 | Yokoyama |
| 2017/0093374 | A1 * | 3/2017 | Yatsenko ............... H03H 9/706 |
| 2017/0214388 | A1 | 7/2017 | Irieda et al. |
| 2017/0244387 | A1 | 8/2017 | Matsuda et al. |
| 2017/0264267 | A1 | 9/2017 | Tajic et al. |
| 2017/0288121 | A1 | 10/2017 | Burak et al. |
| 2017/0288122 | A1 | 10/2017 | Zou et al. |
| 2017/0331457 | A1 * | 11/2017 | Satoh ..................... H10N 30/40 |
| 2018/0013401 | A1 | 1/2018 | Lee et al. |
| 2018/0048287 | A1 | 2/2018 | Lee et al. |
| 2018/0085787 | A1 * | 3/2018 | Burak ................. H03H 9/02118 |
| 2018/0115302 | A1 | 4/2018 | Yeh et al. |
| 2018/0219528 | A1 | 8/2018 | Liu et al. |
| 2018/0254764 | A1 | 9/2018 | Lee et al. |
| 2018/0278231 | A1 | 9/2018 | Hurwitz |
| 2018/0309427 | A1 | 10/2018 | Kim et al. |
| 2018/0351533 | A1 * | 12/2018 | Lee ..................... H03H 9/02086 |
| 2019/0036592 | A1 * | 1/2019 | Shealy ................... H04B 1/006 |
| 2019/0115901 | A1 | 4/2019 | Takahashi et al. |
| 2019/0326873 | A1 * | 10/2019 | Bradley ............... H03H 9/0211 |
| 2019/0363692 | A1 | 11/2019 | Nosaka |
| 2020/0021273 | A1 * | 1/2020 | Sung ..................... H03H 9/605 |
| 2020/0083861 | A1 | 3/2020 | Matsuo et al. |
| 2020/0099359 | A1 | 3/2020 | Shin et al. |
| 2020/0119713 | A1 | 4/2020 | Kim et al. |
| 2020/0168785 | A1 | 5/2020 | Ikeuchi et al. |
| 2020/0204148 | A1 | 6/2020 | Kim et al. |
| 2020/0350888 | A1 * | 11/2020 | Moulard .................. H03H 3/02 |
| 2020/0366266 | A1 | 11/2020 | Pollard et al. |
| 2020/0366271 | A1 | 11/2020 | Kim et al. |
| 2020/0373901 | A1 | 11/2020 | Liu et al. |
| 2020/0373911 | A1 | 11/2020 | Wang et al. |
| 2021/0028765 | A1 | 1/2021 | Wang et al. |
| 2021/0083643 | A1 * | 3/2021 | Liu ......................... H03H 9/564 |
| 2022/0393664 | A1 | 12/2022 | Liu et al. |
| 2023/0006642 | A1 | 1/2023 | Liu et al. |
| 2023/0109382 | A1 | 4/2023 | Liu et al. |
| 2023/0188115 | A1 | 6/2023 | Hatano |
| 2023/0261637 | A1 | 8/2023 | Matsuo et al. |
| 2023/0299744 | A1 | 9/2023 | Zhang et al. |

FOREIGN PATENT DOCUMENTS

| | | |
|---|---|---|
| JP | 2007208845 A | 8/2007 |
| JP | 2007288645 A | 11/2007 |
| JP | 2014090414 A | 5/2014 |
| WO | 2006129532 A1 | 12/2006 |
| WO | 2007119556 A1 | 10/2007 |
| WO | 2008126473 A1 | 10/2008 |
| WO | 2019029912 A1 | 2/2019 |

* cited by examiner

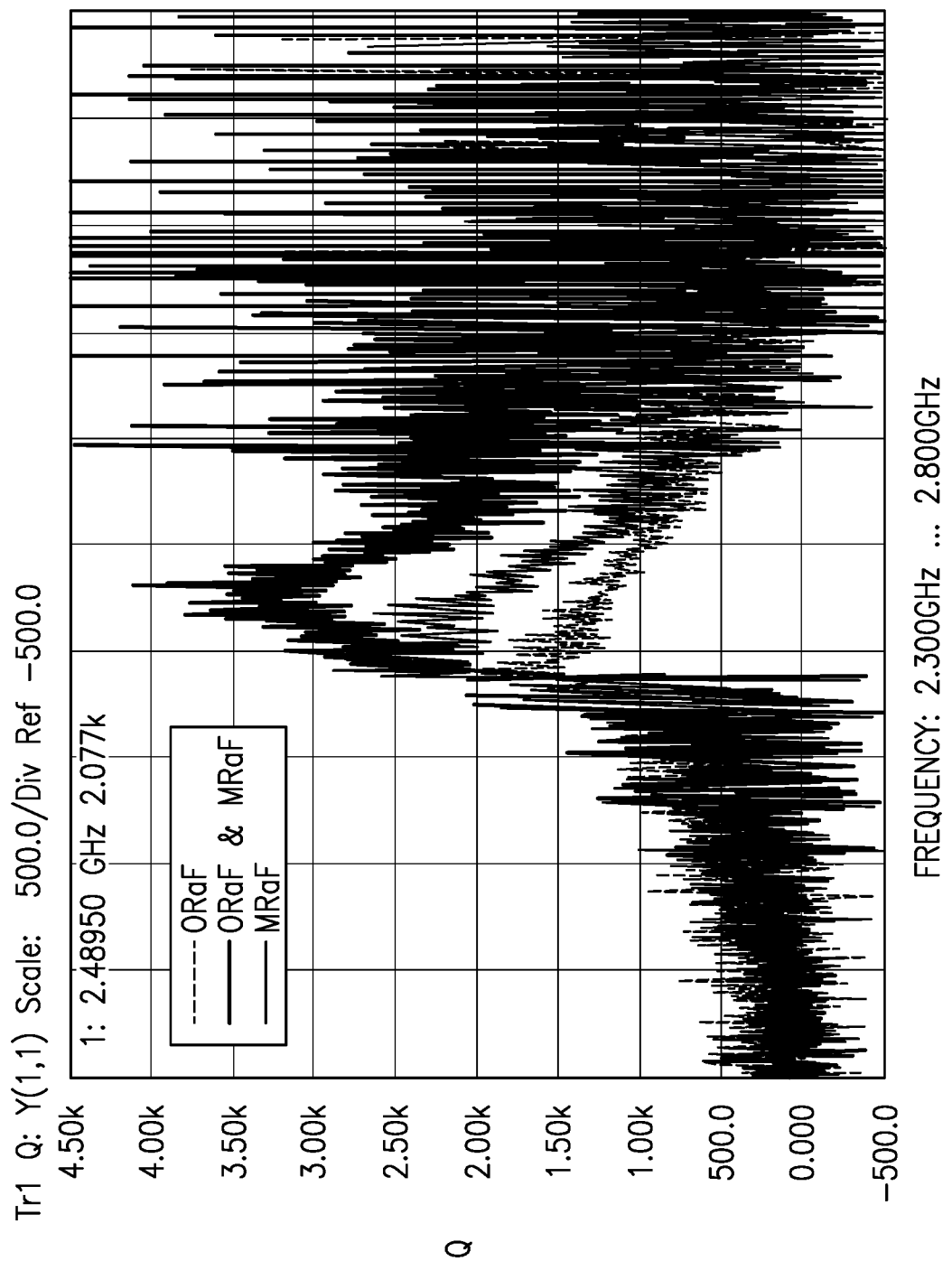

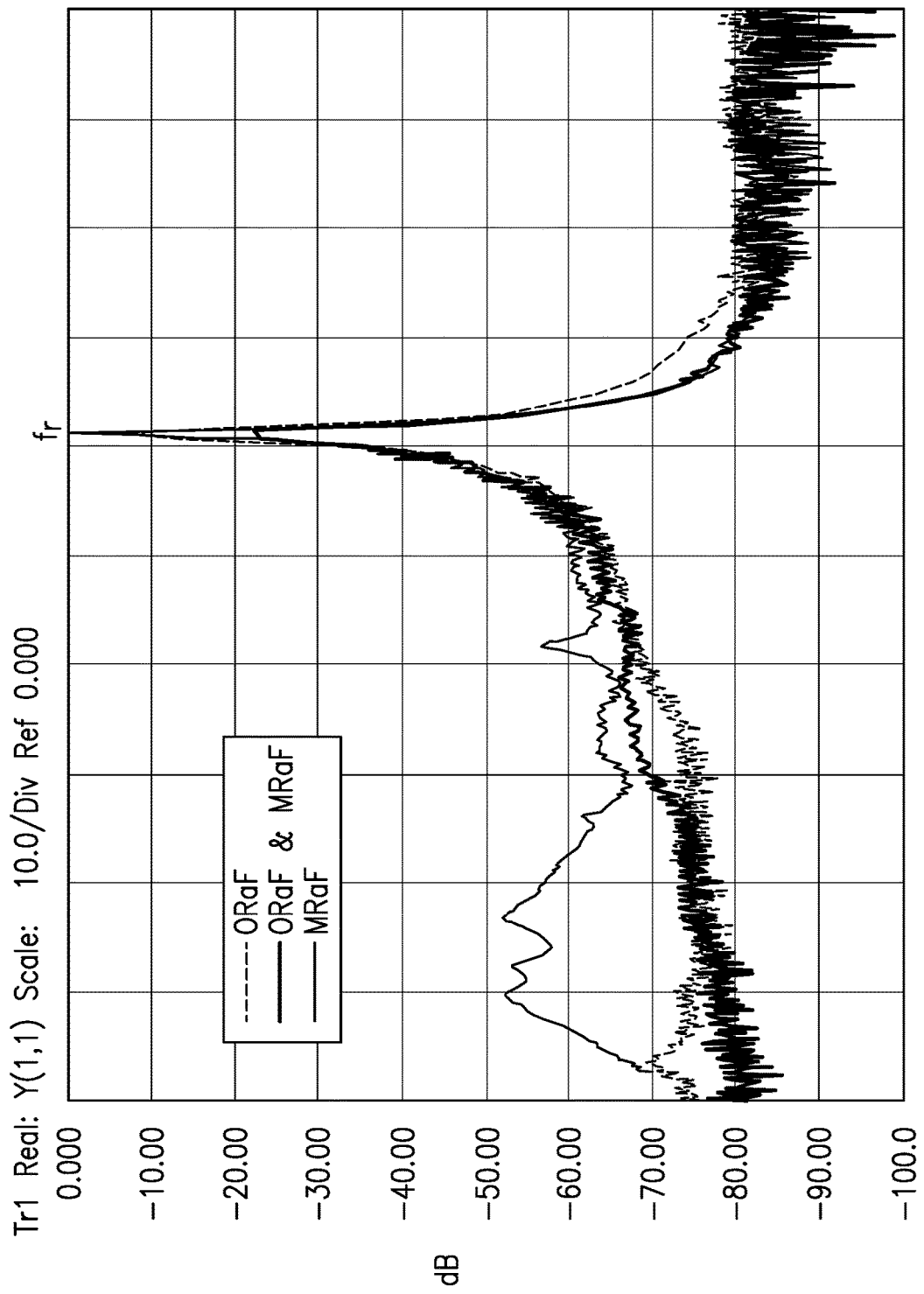

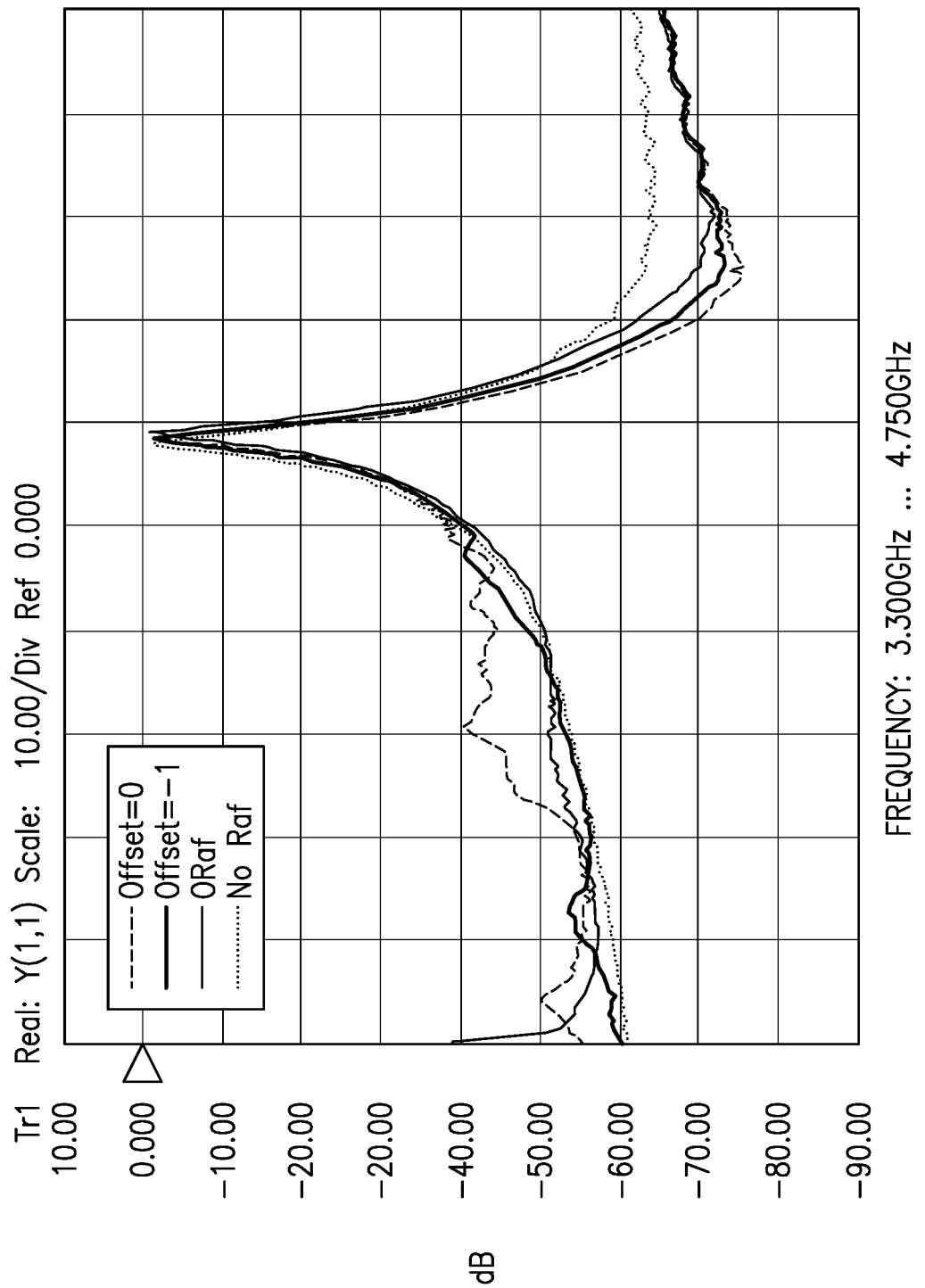

BULK ACOUSTIC WAVE RESONATOR WITH OXIDE RAISED FRAME

CROSS-REFERENCE TO RELATED APPLICATIONS

This application claims priority under 35 U.S.C. § 119(e) to U.S. Provisional Patent Application Serial No. 63/188,734, titled "BULK ACOUSTIC WAVE/FILM BULK ACOUSTIC WAVE RESONATOR WITH OXIDE RAISED FRAME," filed May 14, 2021, the entire contents of which being incorporated herein by reference for all purposes.

BACKGROUND

Technical Field

Embodiments of this disclosure relate to acoustic wave devices and structures and methods of mitigating spurious signals in same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer or diplexer.

SUMMARY

In accordance with one aspect, there is provided a ladder filter. The ladder filter comprises an input port and an output port, a plurality of series arm bulk acoustic wave resonators electrically connected in series between the input port and the output port, and a plurality of shunt bulk acoustic wave resonators electrically connected between respective adjacent ones of the plurality of series arm bulk acoustic wave resonators and ground, each of the plurality of series arm bulk acoustic resonators and the plurality of shunt bulk acoustic resonators including a central active region and a raised frame region outside of the central active region, each of the plurality of series arm bulk acoustic resonators and the plurality of shunt bulk acoustic resonators including a piezoelectric film, at least one of the plurality of series arm bulk acoustic wave resonators including a layer of oxide disposed directly on the piezoelectric film in the raised frame region, and a metal layer disposed directly on the piezoelectric film in the central active region and disposed on the layer of oxide in the raised frame region, the metal layer having a thickness in the raised frame region that is no greater than the thickness of the metal layer in the central active region to reduce spurious mode signals in the at least one of the plurality of series arm bulk acoustic wave resonators.

In some embodiments, the plurality of series arm bulk acoustic wave resonators are each film bulk acoustic wave resonators.

In some embodiments, the plurality of shunt bulk acoustic wave resonators are each film bulk acoustic wave resonators.

In some embodiments, each of the plurality of series arm film bulk acoustic wave resonators and each of the plurality of shunt film bulk acoustic wave resonators include the piezoelectric film disposed in the central active region, and in a recessed frame region circumscribing the central region, the central active region defining a main active domain in which a main acoustic wave is generated during operation.

In some embodiments, each of the plurality of shunt film bulk acoustic wave resonators include the raised frame region disposed on opposite sides of the recessed frame region from the central active region.

In some embodiments, the raised frame region of each of the plurality of shunt film bulk acoustic wave resonators have approximately a same width.

In some embodiments, at least one of the plurality of shunt film bulk acoustic wave resonators has a raised frame region with a width less than a width of raised frame region of another of the plurality of shunt film bulk acoustic wave resonators.

In some embodiments, each of the plurality of series arm film bulk acoustic wave resonators include the layer of oxide disposed directly on the piezoelectric film in the raised frame region, and the metal layer disposed directly on the piezoelectric film in the central active region and disposed on the oxide layer in the raised frame region, the metal layer having a thickness in the raised frame region no greater than the thickness of the metal layer in the central active region.

In some embodiments, each of the plurality of series arm film bulk acoustic wave resonators have a same resonant frequency.

In some embodiments, each of the plurality of shunt film bulk acoustic wave resonators have a resonant frequency below the resonant frequency of each of the plurality of series arm film bulk acoustic wave resonators.

In some embodiments, at least one of the plurality of shunt film bulk acoustic wave resonators has a first resonant frequency different from resonant frequencies of others of the plurality of shunt film bulk acoustic wave resonators.

In some embodiments, at least one of the plurality of shunt film bulk acoustic wave resonators has a second resonant frequency different from the first resonant frequency and different from the resonant frequencies of others of the plurality of shunt film bulk acoustic wave resonators.

In some embodiments, the ladder filter exhibits a greater insertion loss at an upper end of a passband of the ladder filter than at a lower end of the passband of the ladder filter.

In some embodiments, the ladder filter has a passband in a radio frequency band.

In some embodiments, the passband is greater than about 200 MHz in width.

In some embodiments, the ladder filter exhibits a relative passband width wider than 5.5%, the relative passband width being defined as the filter bandwidth divided by the filter center frequency.

In some embodiments, the plurality of series arm bulk acoustic wave resonators includes at least one solidly mounted resonator.

In some embodiments, the plurality of shunt bulk acoustic wave resonators includes at least one solidly mounted resonator.

In accordance with another aspect, there is provided an electronics module comprising a radio frequency ladder filter. The ladder filter comprises a plurality of series arm film bulk acoustic wave resonators electrically connected in series between an input port and an output port of the ladder filter and a plurality of shunt film bulk acoustic wave resonators electrically connected between adjacent ones of the plurality of series arm film bulk acoustic wave resonators and ground, each of the plurality of series arm film bulk acoustic resonators including a central active region and a raised frame region outside of the central active region, each of the plurality of series arm film bulk acoustic resonators including a piezoelectric film, at least one of the plurality of series arm bulk acoustic wave resonators including a layer of oxide disposed directly on the piezoelectric film in the raised frame region, and a metal layer disposed directly on the piezoelectric film in the central active region and disposed on the layer of oxide in the raised frame region, the metal layer having a thickness in the raised frame region no greater than the thickness of the metal layer in the central active region.

In accordance with another aspect, there is provided an electronic device comprising an electronics module including a radio frequency ladder filter. The ladder filter comprises a plurality of series arm film bulk acoustic wave resonators electrically connected in series between an input port and an output port of the ladder filter and a plurality of shunt film bulk acoustic wave resonators electrically connected between adjacent ones of the plurality of series arm film bulk acoustic wave resonators and ground, each of the plurality of series arm film bulk acoustic resonators and the plurality of shunt film bulk acoustic resonators including a central active region and a raised frame region outside of the central active region, each of the plurality of series arm film bulk acoustic resonators and the plurality of shunt film bulk acoustic resonators including a piezoelectric film, at least one of the plurality of series arm film bulk acoustic wave resonators including a layer of oxide disposed directly on the piezoelectric film in the raised frame region, and a metal layer disposed directly on the piezoelectric film in the central active region and disposed on the layer of oxide in the raised frame region, the metal layer having a thickness in the raised frame region no greater than the thickness of the metal layer in the central active region.

In accordance with another aspect, there is provided a film bulk acoustic wave resonator. The film bulk acoustic wave resonator comprises a piezoelectric film disposed in a central region defining a main active domain in which a main acoustic wave is generated during operation, and in a recessed frame region circumscribing the central region, a layer of oxide disposed directly on the piezoelectric film in the raised frame region, and a metal layer disposed directly on the piezoelectric film in the central region and disposed on the layer of oxide in the raised frame region, the metal layer having a thickness in the raised frame region no greater than the thickness of the metal layer in the central region.

In accordance with another aspect, there is provided a radio frequency filter. The radio frequency filter comprises a film bulk acoustic wave resonator including a piezoelectric film disposed in a central region defining a main active domain in which a main acoustic wave is generated during operation, and in a recessed frame region circumscribing the central region, a layer of oxide disposed directly on the piezoelectric film in the raised frame region, and a metal layer disposed directly on the piezoelectric film in the central region and disposed on the layer of oxide in the raised frame region, the metal layer having a thickness in the raised frame region no greater than the thickness of the metal layer in the central region.

In accordance with another aspect, there is provided an electronics module. The electronics module comprises a radio frequency filter including a film bulk acoustic wave resonator having a piezoelectric film disposed in a central region defining a main active domain in which a main acoustic wave is generated during operation, and in a recessed frame region circumscribing the central region, a layer of oxide disposed directly on the piezoelectric film in the raised frame region, and a metal layer disposed directly on the piezoelectric film in the central region and disposed on the layer of oxide in the raised frame region, the metal layer having a thickness in the raised frame region no greater than the thickness of the metal layer in the central region.

In accordance with another aspect, there is provided an electronic device. The electronic device comprises an electronics module including a radio frequency filter having a film bulk acoustic wave resonator with a piezoelectric film disposed in a central region defining a main active domain in which a main acoustic wave is generated during operation, and in a recessed frame regions circumscribing the central region, a layer of oxide disposed directly on the piezoelectric film in the raised frame region, and a metal layer disposed directly on the piezoelectric film in the central region and disposed on the layer of oxide in the raised frame region, the metal layer having a thickness in the raised frame region no greater than the thickness of the metal layer in the central region.

BRIEF DESCRIPTION OF THE DRAWINGS

Embodiments of this disclosure will now be described, by way of non-limiting example, with reference to the accompanying drawings.

FIG. 5C is a chart illustrating a comparison of quality factor versus frequency for different film bulk acoustic resonators having a first raised frame width and different forms of raised frame structures;

FIG. 6A is a chart illustrating a comparison of the Y11 admittance parameter versus frequency for different film bulk acoustic resonators having a second raised frame width and different forms of raised frame structures;

FIG. 10A is a chart illustrating a comparison of the Y11 admittance parameter versus frequency for different film bulk acoustic resonators having a second resonant frequency and different forms of raised frame structures;

DETAILED DESCRIPTION OF CERTAIN EMBODIMENTS

Figure 1:
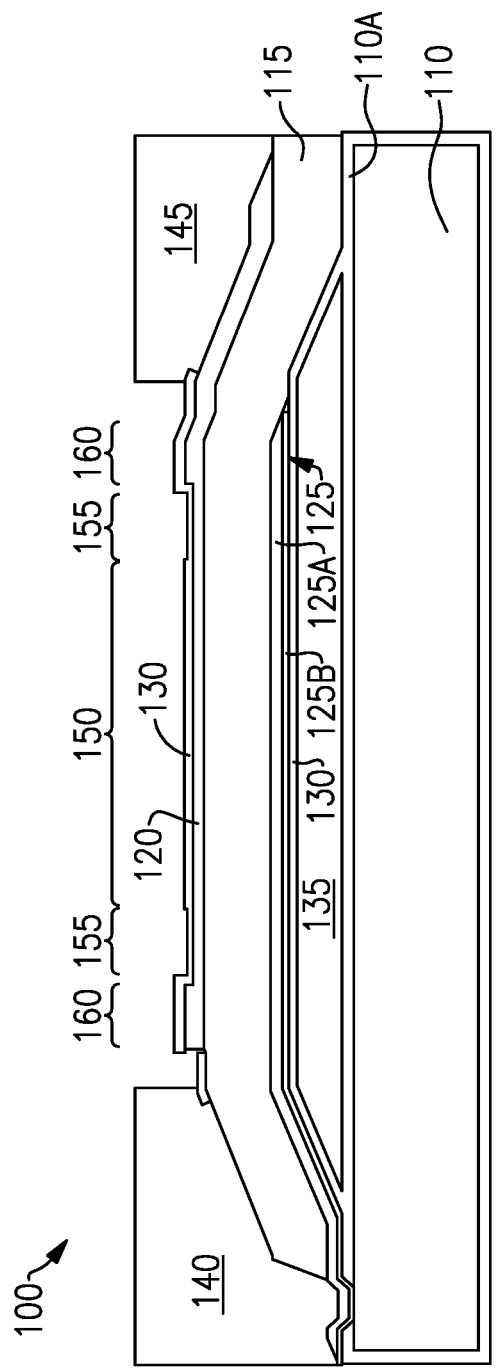
FIG. 1 is a cross-sectional view of an example of a film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. A recessed frame region or regions 155 may bound and define the lateral extent of the central region 150. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150 and/or the difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. A raised frame region or regions 160 may be defined on an opposite side of the recessed frame region(s) 155 from the central region 150 and may directly abut the outside edge(s) of the recessed frame region(s) 155. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. The raised frame region(s) may be, for example, 1 µm or more in width.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

It should be appreciated that the FBAR illustrated in FIG. 1 and the FBARs and other structures illustrated in the other figures accompanying this disclosure are illustrated in a highly simplified form. The relative dimensions of the different features are not shown to scale. Further, embodiments of FBARs may include additional features or layers not illustrated or may lack one or more features or layers illustrated herein.

Figure 2:
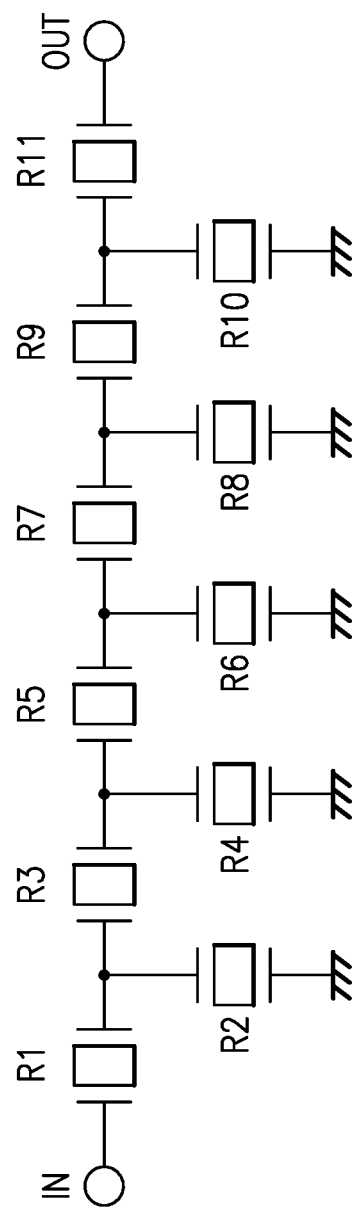
FIG. 2 illustrates an example of a ladder filter.

FBARs or other acoustic wave resonators may be combined to form a filter structure that may operate in the radio frequency (RF) band. One type of an acoustic wave resonator-based RF filter is known as a ladder filter. One example of a ladder filter is illustrated in FIG. 2. The filter of FIG. 2 includes a plurality of acoustic wave resonators R1, R2, R3, R4, R5, R6, R7, R8, R9, R10, and R11 disposed between an input port (IN) and an output port (OUT). Resonators R1, R3, R5, R7, R9, and R11 are connected in series between the input port and output port. Resonators R2, R4, R6, R8, and R10 are connected between terminals of resonators R1, R3, R5, R7, and R9 and ground. Resonators R2, R4, R6, R8, and R10 may also be referred to as shunt resonators. In some embodiments, each of the series resonators R1, R3, R5, R7, R9, and R11 may have the same resonant frequency. In some embodiments, each of the plurality of shunt resonators R2, R4, R6, R8, and R10 have a resonant frequency below the resonant frequency of each of the series arm resonators R1, R3, R5, R7, and R9, and R11. At least one of the plurality of shunt resonators R2, R4, R6, R8, and R10 may have a first resonant frequency different from resonant frequencies of others of the plurality of shunt resonators. At least one of the plurality of shunt resonators R2, R4, R6, R8, and R10 may have a second resonant frequency different from the first resonant frequency and different from the resonant frequencies of others of the plurality of shunt resonators.

For ultrawide bandwidth filter implementations, for example, B41 full band (2496 MHz-2690 MHz, a 7.5% relative bandwidth RBW), because the filter passband is so wide, the series resonators in a ladder filter for such implementations should desirably exhibit high admittance (e.g., the Y21 filter parameter) not only at the resonant frequency of the series resonators fs, but also at frequencies below, for example, 100 MHz, 120 MHz, or more below fs. A ladder filter as disclosed herein may have an RBW wider than 5.5% or wider than 7.5% to facilitate use in ultrawide bandwidth filter implementations. Typical FBAR resonators, for example, as illustrated in FIG. 1 may exhibit a degradation in admittance that is larger than desirable at frequencies below, for example, 100 MHz or more below fs and may thus not provide optimal functionality for filters intended for use in ultrawide bandwidth implementations, for example, for filters for the B41 full band. It has been discovered that the raised frame structure in a conventional FBAR may help increase the quality factor Q of the resonator but may degrade the admittance of the resonator at frequencies below fs of the resonator. A conventional raised frame structure may improve Y21 performance close to the fs of a FBAR, but not in a frequency range 100 MHz or more lower than the fs of the FBAR.

Figure 3A:
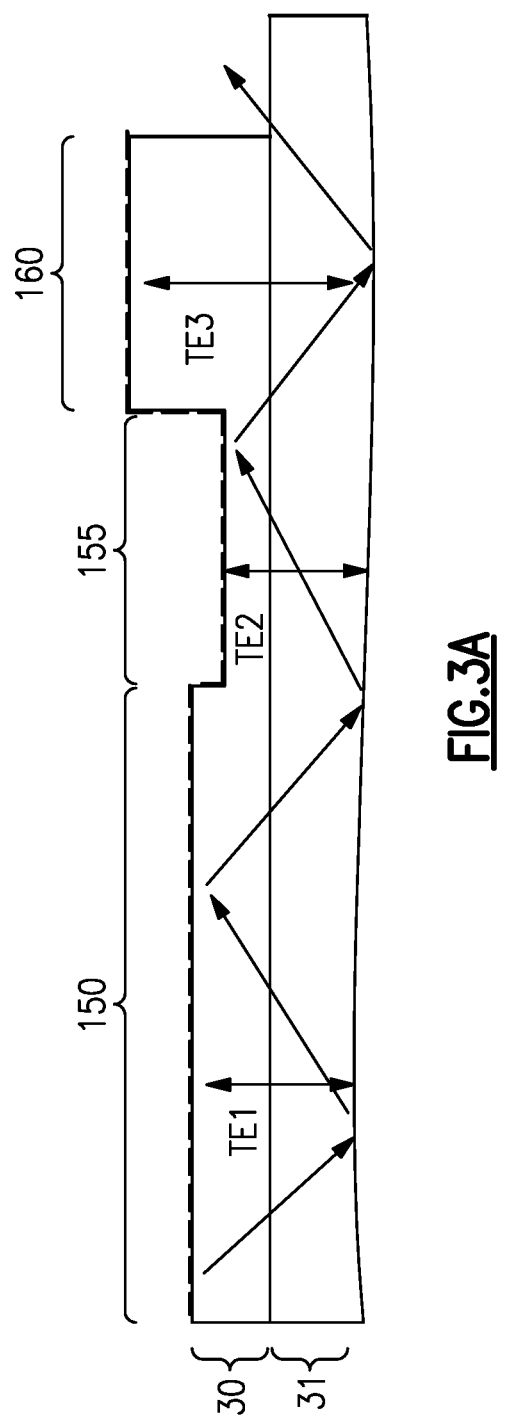
FIG. 3A is a highly schematic cross-sectional illustration of a portion of a film bulk acoustic wave resonator.
Figure 3C:
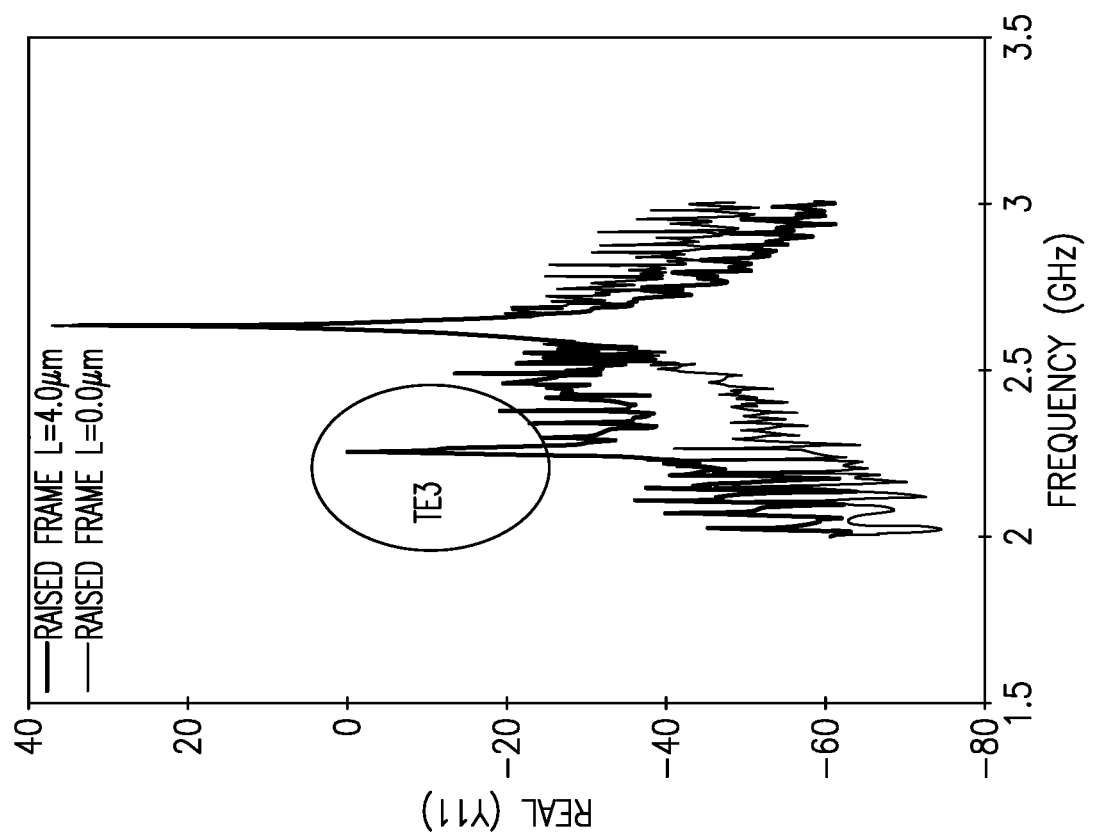
FIG. 3C illustrates curves of admittance in another portion of the film bulk acoustic wave resonator of FIG. 3A with and without a raised frame region.
Figure 3B:
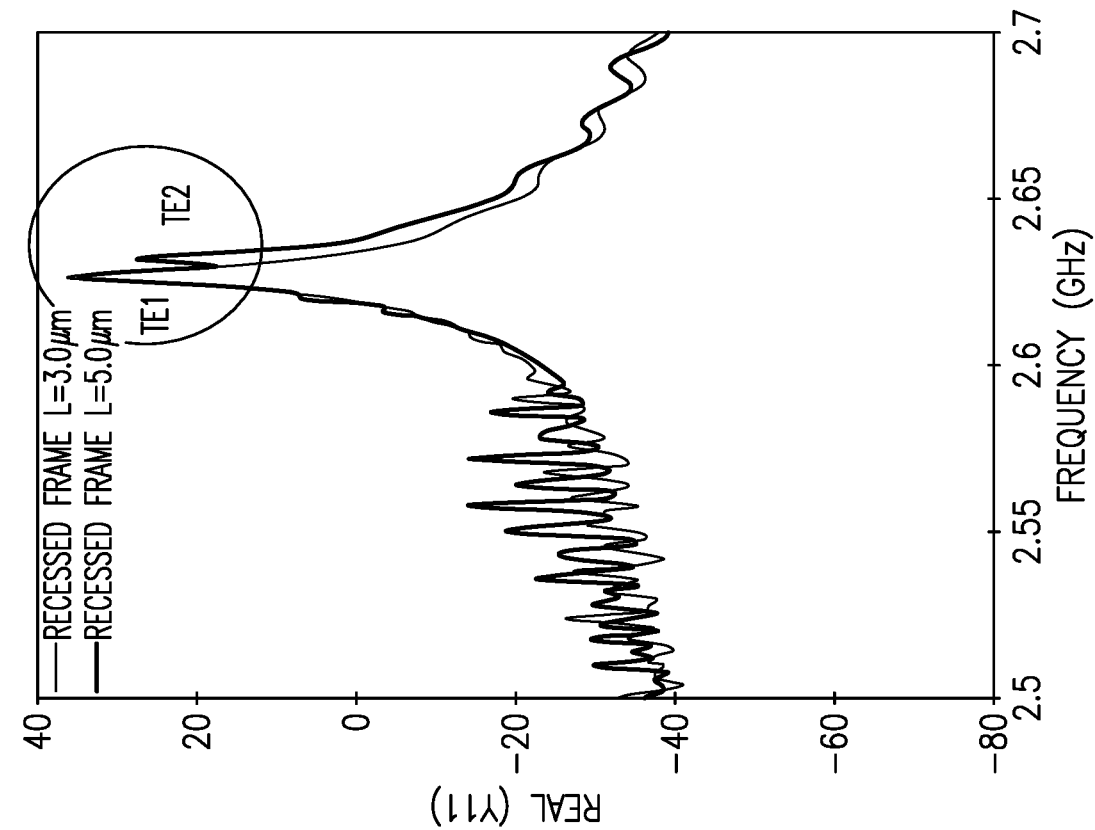
FIG. 3B illustrates curves of admittance in first portions of the film bulk acoustic wave resonator of FIG. 3A with a recessed frame region (ReF) having a width of 3 µm or 5 µm.

It has been found that spurious signals in the admittance of a FBAR including a raised frame region may be generated in the raised frame region. In one example, the admittance curves of an example FBAR were simulated at measurement locations TE1, TE2, and TE3 in the central region 150, recessed frame region 155, and raised frame region 160, respectively, as illustrated in FIG. 3A. In FIG. 3A upper region 30 represents a region including frames and may include the top electrode 120 and top dielectric material layer 130. Lower region 31 represents a region of the FBAR not including frames and may include film of piezoelectric material 115 and bottom electrode 125. The simulated example FBAR exhibited spurious signals below the resonant frequency, for example, from about 2.5 GHz to about 2.6 GHz in the central region 150 and recessed frame region 155 that is not smaller or suppressed in amplitude although spurious noise suppression is a little better from about 2.6 Ghz to TE1 (fs) as the width of the recessed frame region was increased from 3 µm to 5 µm as illustrated in FIG. 3B. A secondary admittance peak also appeared above the resonant frequency of the FBAR as the width of the recessed frame region was increased from 3 µm to 5 µm. As illustrated in the FIG. 3C, in the raised frame region 160, spurious signals in the admittance appeared from about 2 GHz to just below the resonant frequency (about 2.63 GHz) when a raised frame region with a width of 4 µm was present. These spurious signals may be the result of what is referred to as thickness extension mode vibrations in the TE1, TE2, or TE3 regions. These spurious signals were substantially suppressed when the FBAR was simulated with no raised frame region (raised frame region width=0 µm), although some spurious signals appeared above the resonant frequency in the FBAR with no raised frame region. FIGS. 3B and 3C thus indicates that the recessed frame may suppress spurious noises near and below the fs frequency band but does not reduce the lower TE mode spurious magnitude like TE3 like the raised frame.

Figure 4A:
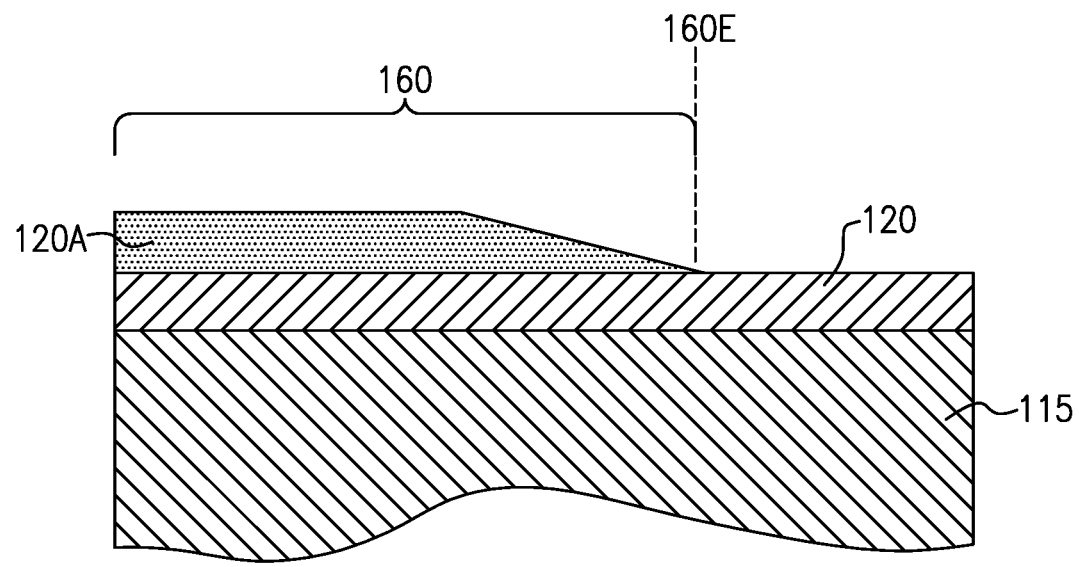
FIG. 4A illustrates an example of a raised frame structure for a film bulk acoustic wave resonator.

The raised frames of FBARs may be formed in a number of different manners. In the example of FIG. 2, the raised frame regions 160 are defined by a thickened region of metal, e.g., the upper electrode 120. The transition from the thinner portions of the upper electrode 120 in the recessed frame region 155 to the raised frame region is illustrated in FIG. 1 as an abrupt transition. In other embodiments, for example, as illustrated in FIG. 4A the thickness of the metal layer in the raised frame region 160 may increase gradually by the addition of a metal layer 120A having a tapered portion and a constant thickness portion that causes the metal layer 120A to gradually, and in some instances, monotonically, increase in thickness moving outward from the inner edge 160E of the raised frame region 160 until reaching the constant thickness potion. The metal layer 120A may be formed of the same metal as the upper electrode 120, but in some embodiments may be formed of a different metal. In FIG. 4A and the following FIGS. 4B-4D, the recessed frame region and any oxide or other passivation layer that may be present on top of the illustrated structures are omitted for clarity. It is to be understood that FBARs in accordance with the present disclosure may have raised frame region structures as illustrated that are mirror-symmetrical on the opposite sides of the FBAR structure.

Figure 4B:
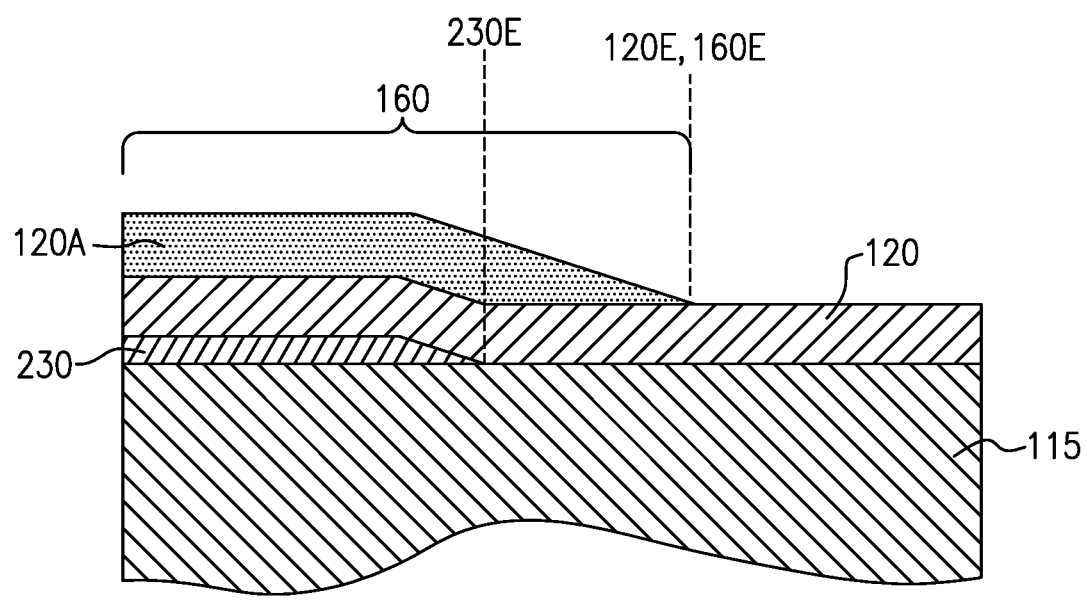
FIG. 4B illustrates another example of a raised frame structure for a film bulk acoustic wave resonator.

In another example of a raised frame structure, illustrated in FIG. 4B, in addition to the metal layer 120A, a layer of oxide 230 may be formed below the upper electrode 120 in the raised frame region. The layer of oxide 230 may have a tapered portion and a constant thickness portion that causes the oxide layer 230 to gradually, and in some instances, monotonically, increase in thickness moving outward from the inner edge 230 of oxide layer 230 until reaching the constant thickness potion. As illustrated in FIG. 4B, the inner edge 120E of the metal layer 120A (and inner edge 160E of raised frame region) may be offset from the inner edge 230E of the oxide layer 230, for example, by about 1 μm.

Figure 4C:
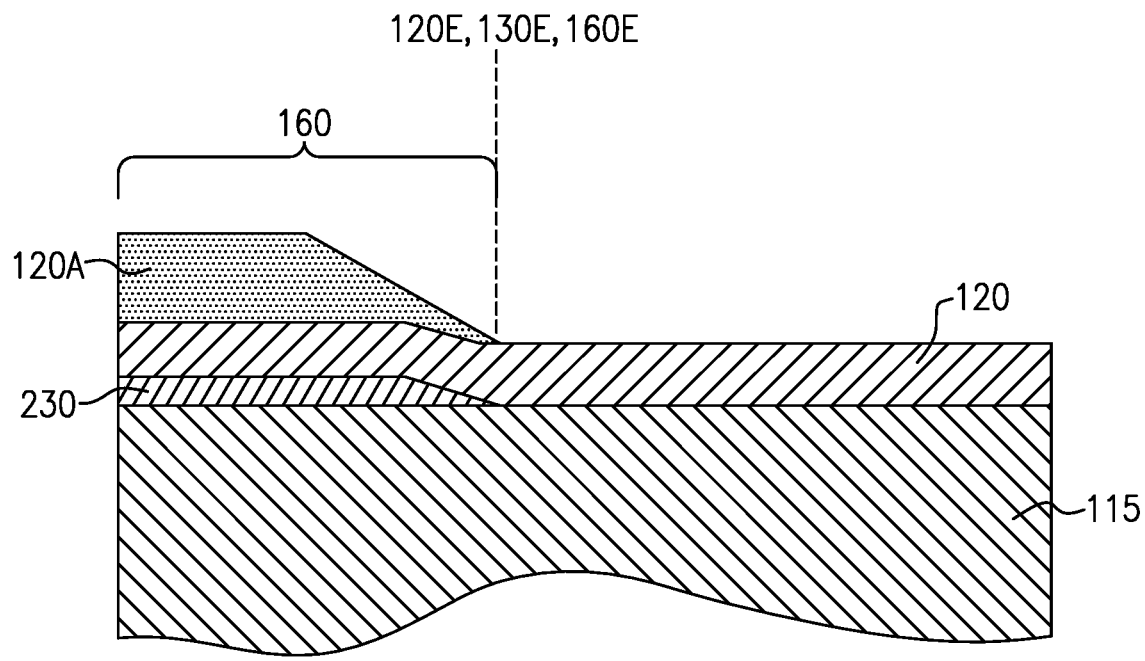
FIG. 4C illustrates another example of a raised frame structure for a film bulk acoustic wave resonator.

Alternatively, in some embodiments, the inner edge 120E of the metal layer 120A (and inner edge 160E of raised frame region) may be substantially aligned with the inner edge 230E of the oxide layer 230 as illustrated in FIG. 4C.

Figure 4D:
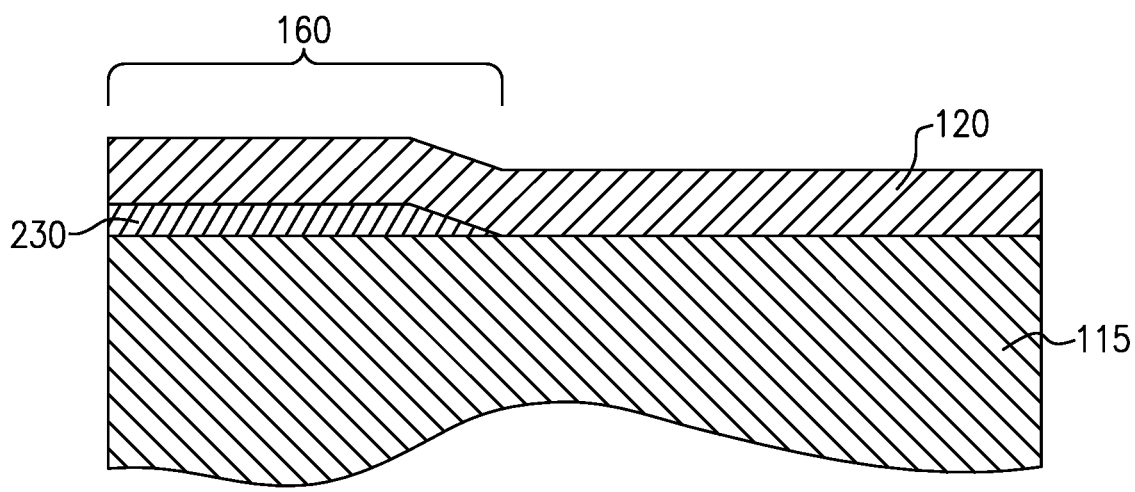
FIG. 4D illustrates another example of a raised frame structure for a film bulk acoustic wave resonator.

In another example, the metal layer 120A may be omitted and the raised frame 160 may be defined by the layer of oxide 230 disposed beneath the metal layer 120 as illustrated in FIG. 4D. The metal layer 120 may have a thickness in the raised frame region 160 that is no greater than the thickness of the metal layer 120 in other regions of the FBAR, for example, in the recessed frame region 155 and central region 150. The metal layer 120 may have the same or substantially same thickness in the raised frame region 160 as in other regions of the FBAR, for example, in the recessed frame region 155 and central region 150.

In any of the above embodiments, the layer of oxide 230 may be a layer of silicon dioxide, although other dielectric materials, for example, silicon nitride, silicon oxynitride, a low acoustic impedance metal (for example, Al/Ti) a polymer, or an oxide of the metal of the metal layer 120 may additionally or alternatively be used.

Figure 5A:
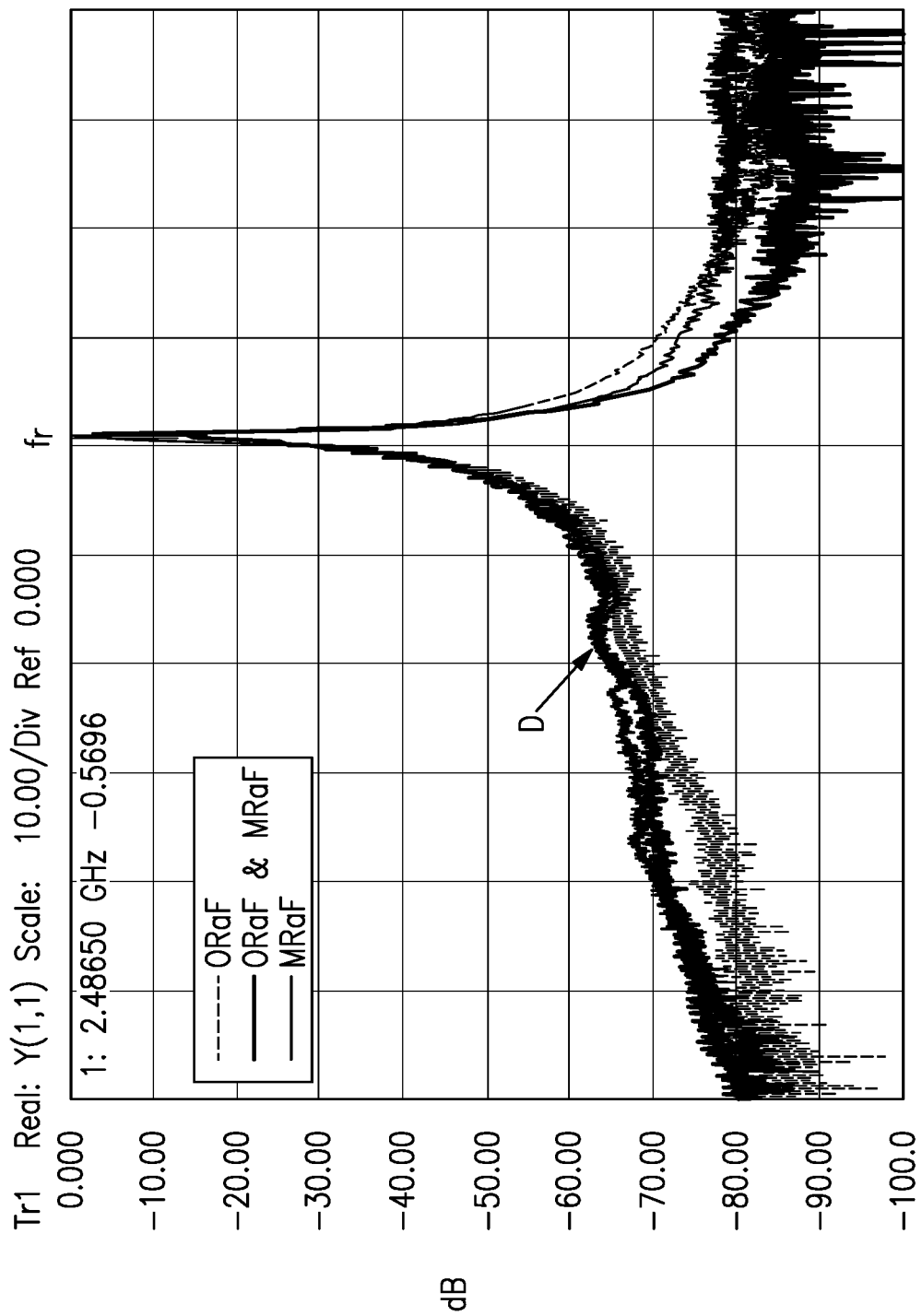
FIG. 5A is a chart illustrating a comparison of the Y11 admittance parameter versus frequency for different film bulk acoustic resonators having a first raised frame width and different forms of raised frame structures.

In an FBAR utilizing a raised frame region structured as illustrated in FIG. 4D where the raised frame region 160 is defined by the layer of oxide 230, an FBAR may exhibit improved conductance (the real Y11 parameter) character-istics below the resonance frequency. This is illustrated in the simulation results of the chart of FIG. 5A. In FIG. 5A the "ORaF" curve represents performance of an FBAR with raised frames formed as illustrated in FIG. 4D with oxide layer 230 but no additional metal layer 120A. The "MRaF" curve represents performance of an FBAR with raised frames formed as illustrated in FIG. 4A with additional metal layer 120A but no oxide layer 230. The "ORaF & MRaF" curve represents performance of an FBAR with raised frames formed as illustrated in FIG. 4B with both the oxide layer 230 and additional metal layer 120A. The "ORaF" curve shows a greatest difference in conductance between frequencies below the resonant frequency $f_r$ versus at the resonant frequency of the FBAR, although not as much of a difference in conductance between frequencies above the resonant frequency versus at the resonant frequency of the FBAR as the "ORaF & MRaF" curve. The "ORaF" curve also does not exhibit the discontinuity indicated at "D" that are present in both the "MRaF" and "ORaF & MRaF" curves.

Figure 5B:
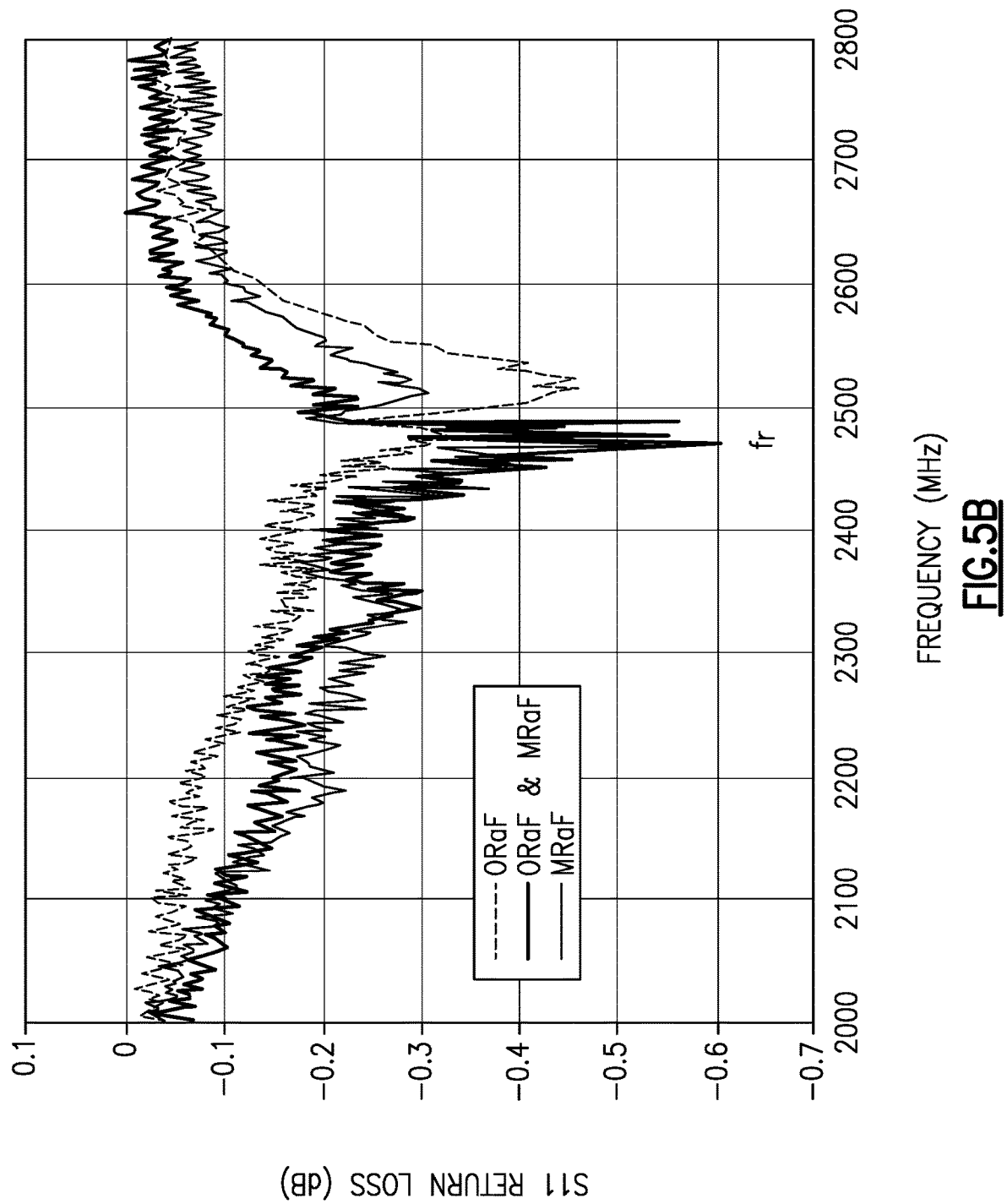
FIG. 5B is a chart illustrating a comparison of the S11 return loss parameter versus frequency for different film bulk acoustic resonators having a first raised frame width and different forms of raised frame structures.

The chart of FIG. 5B shows results of simulations of the performance of FBARs with "ORaF", "MRaF", and "ORaF & MRaF" type raised frame regions with respect to the S11 return loss parameter. The FBAR with raised frames formed as illustrated in FIG. 4D with oxide layer 230 but no additional metal layer 120A (the "ORaF" curve) exhibited better S11 performance below the resonance frequency than FBARs having the other forms of raised frames. The FBAR with "ORaF" type raised frames exhibited less favorable S11 performance just above the resonance frequency of the FBAR, but above about 100 MHz above the resonance frequency, exhibited similar S11 performance as the FBARs with the other raised frame types.

The chart of FIG. 5C shows results of simulations of the performance of FBARs with "ORaF", "MRaF", and "ORaF & MRaF" type raised frame regions with respect to the quality factor parameter Q. The FBARs with the three different raised fame configurations exhibited similar quality factor performance below their resonance frequencies. The quality factor performance of the FBAR with raised frames formed as illustrated in FIG. 4D with oxide layer 230 but no additional metal layer 120A was degraded as compared to the FBARs with the other types of raised frame structures above the resonance frequency of the FBARs.

Figure 6B:
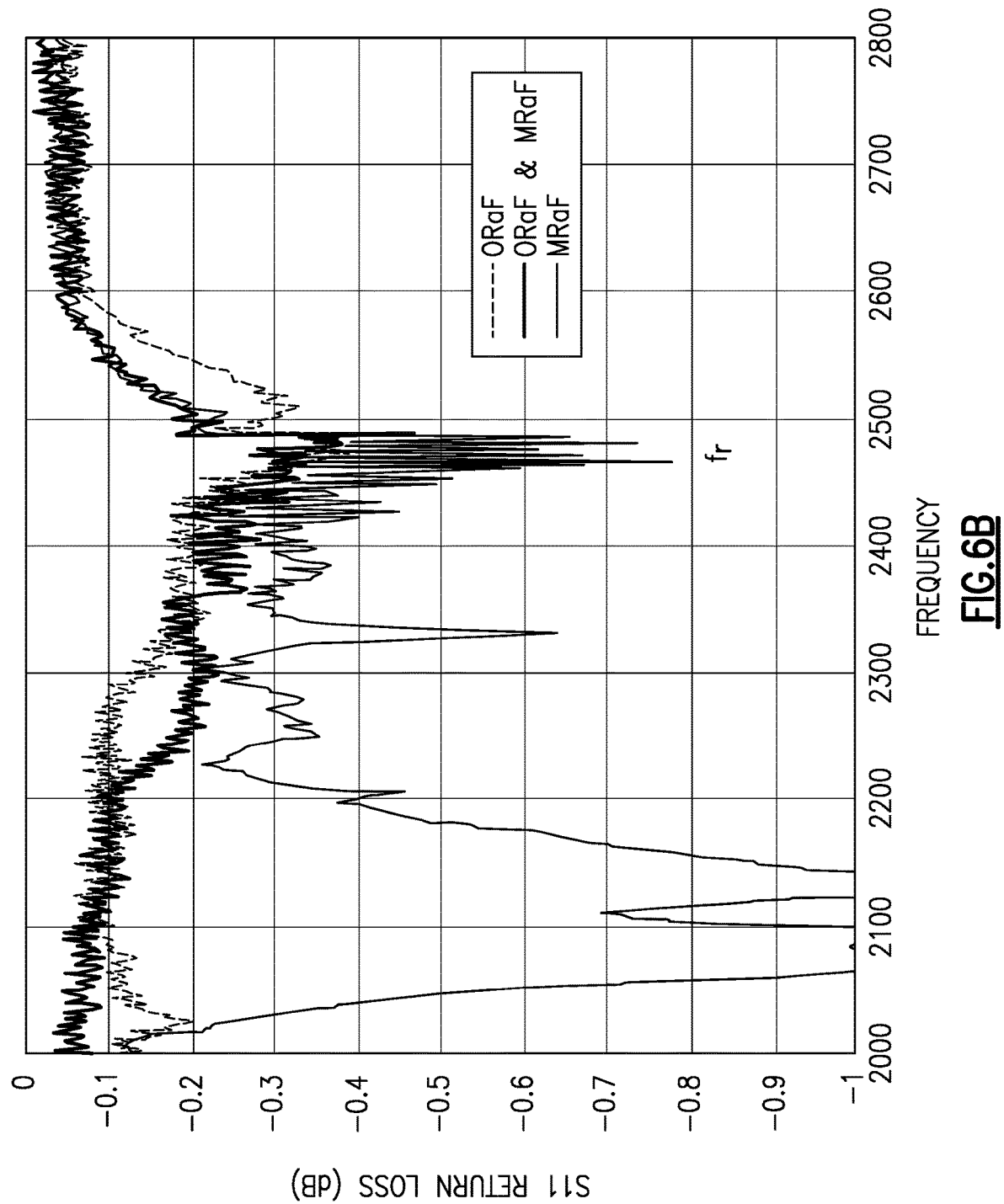
FIG. 6B is a chart illustrating a comparison of the S11 return loss parameter versus frequency for different film bulk acoustic resonators having a second raised frame width and different forms of raised frame structures.
Figure 6C:
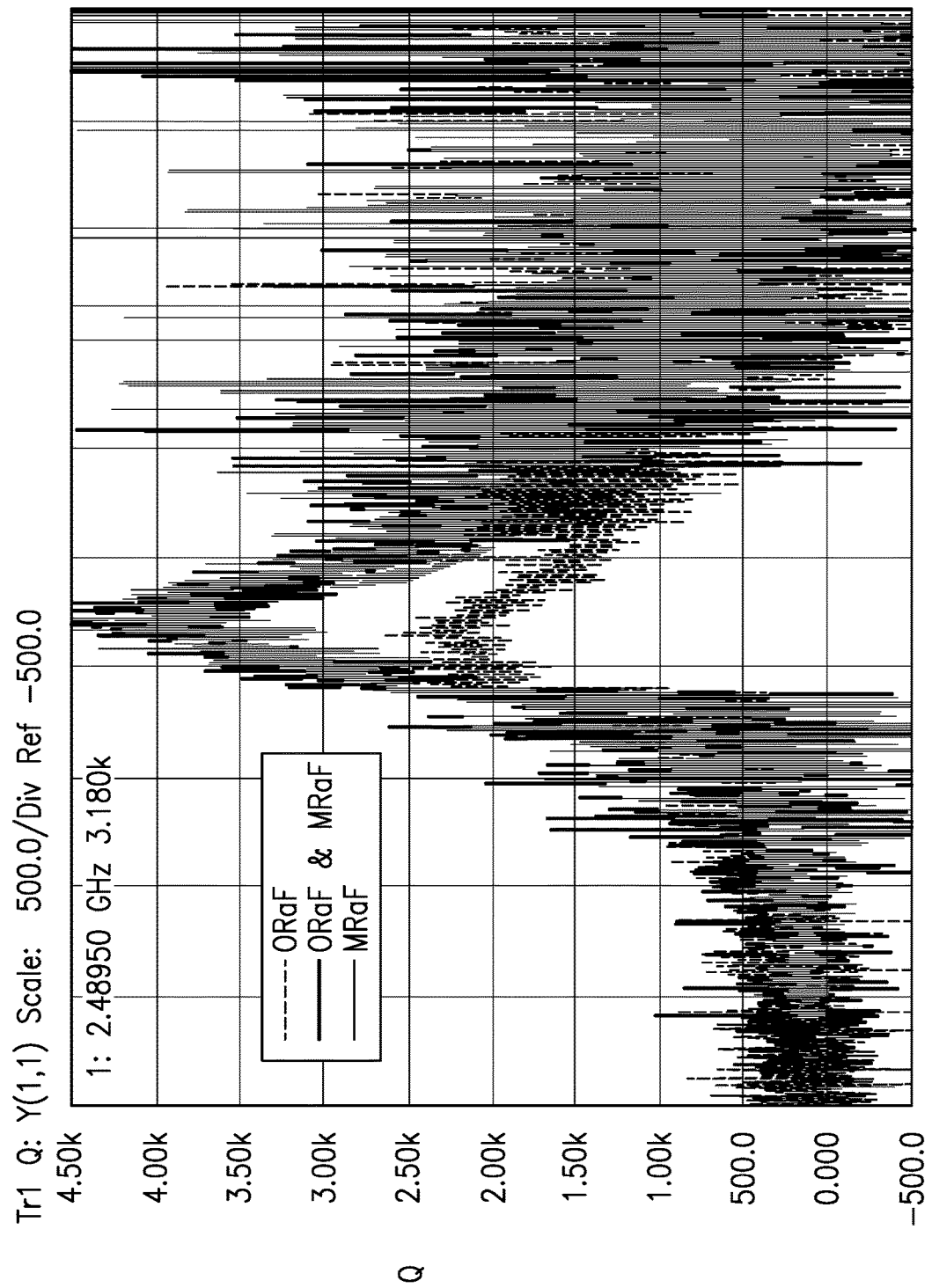
FIG. 6C is a chart illustrating a comparison of quality factor versus frequency for different film bulk acoustic resonators having a second raised frame width and different forms of raised frame structures.

In each of FIGS. 5A-5C the simulated FBARs had raised frame widths of 1 μm. FIGS. 6A-6C show the results of similar simulations as FIGS. 5A-5C, but with simulated FBARs having raised frame widths of 2.8 μm. Similar trends as in the charts of FIGS. 5A-5C can be seen in the charts of FIGS. 6A-6C, but with the FBAR having raised frames formed as illustrated in FIG. 4A with additional metal layer 120A but no oxide layer 230 (the "MRaF" curve) showing even worse performance with respect to the Y11 conductance parameter and S11 return loss parameter as compared to the other simulated FBARs below the resonant frequencies (e.g., about 2.5 GHz).

Figure 7:
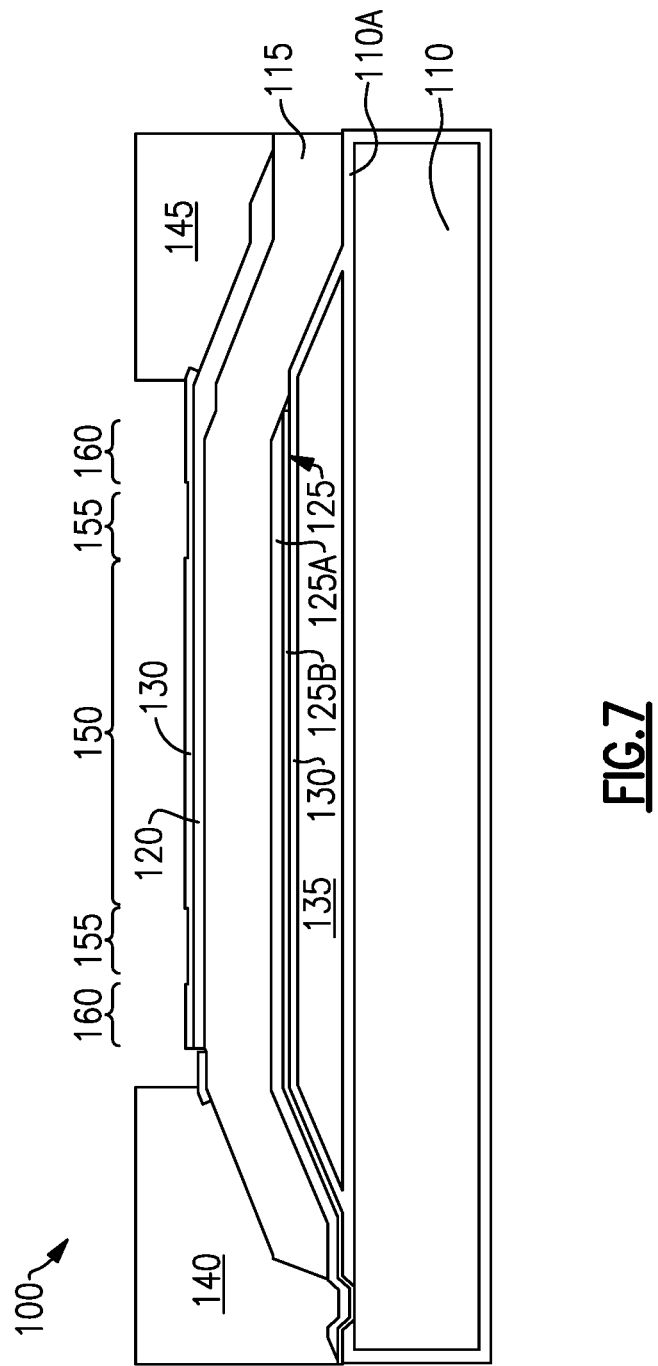
FIG. 7 illustrates an example of a film bulk acoustic resonator having no raised frames.
Figure 8A:
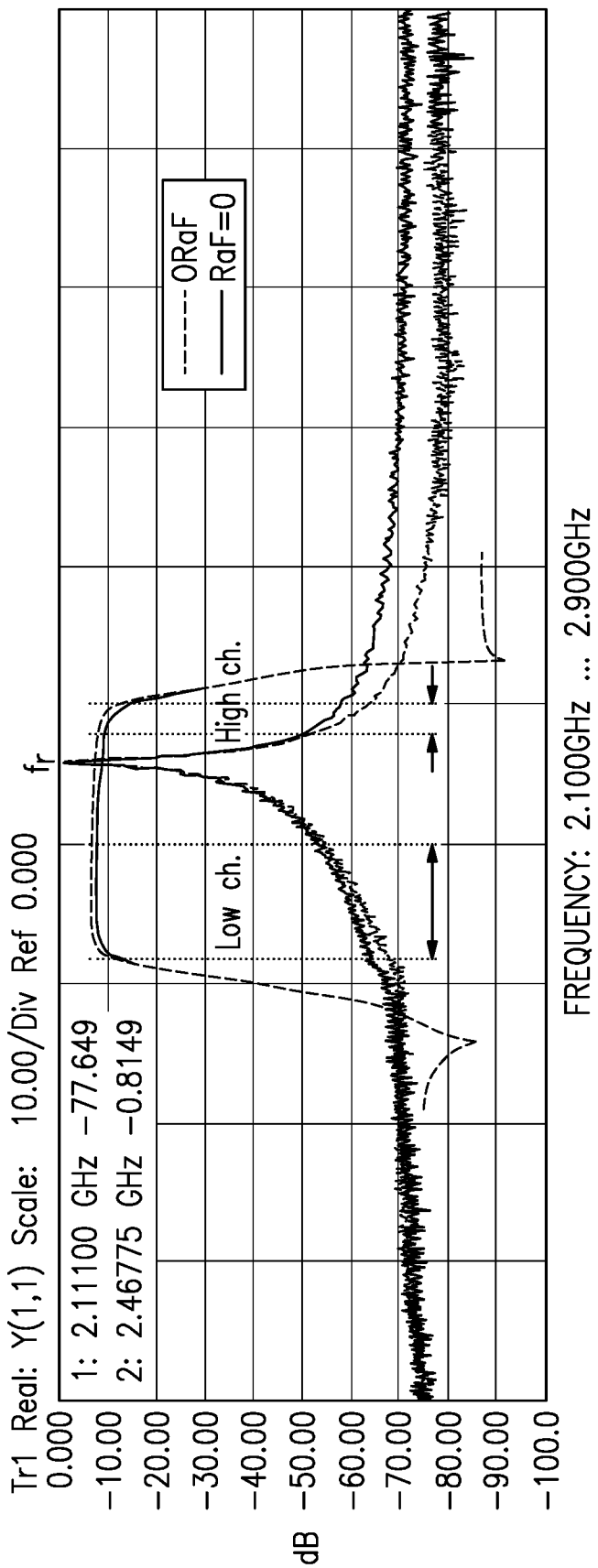
FIG. 8A is a chart illustrating a comparison of the Y11 admittance parameter versus frequency for different film bulk acoustic resonators having either a raised frame region defined by an oxide layer or no raised frame.

Simulations were also performed to compare the performance of an FBAR with raised frames formed as illustrated in FIG. 4D with oxide layer 230 but no additional metal layer 120A and with a raised frame width of 1 μm against the performance of an FBAR with no raised frame, for example, as illustrated in FIG. 7. The results of simulation of the Y11 conductance parameters for the FBAR with raised frames formed as illustrated in FIG. 4D ("ORaF" curve) as compared to a FBAR with no raised frames ("RaF=0" curve) are illustrated in FIG. 8A. As can be observed, the FBAR with the raised frames formed from the oxide layer exhibited conductance both above and below the resonance frequency lower than the conductance both above and below the resonance frequency than the FBAR with no raised frames. This indicates that the FBAR with raised frames formed as illustrated in FIG. 4D with oxide layer 230 but no additional metal layer 120A would exhibit better insertion loss both above and below the resonance frequency (both low channel and high channel insertion loss) than the FBAR with no raised frames.

Figure 8B:
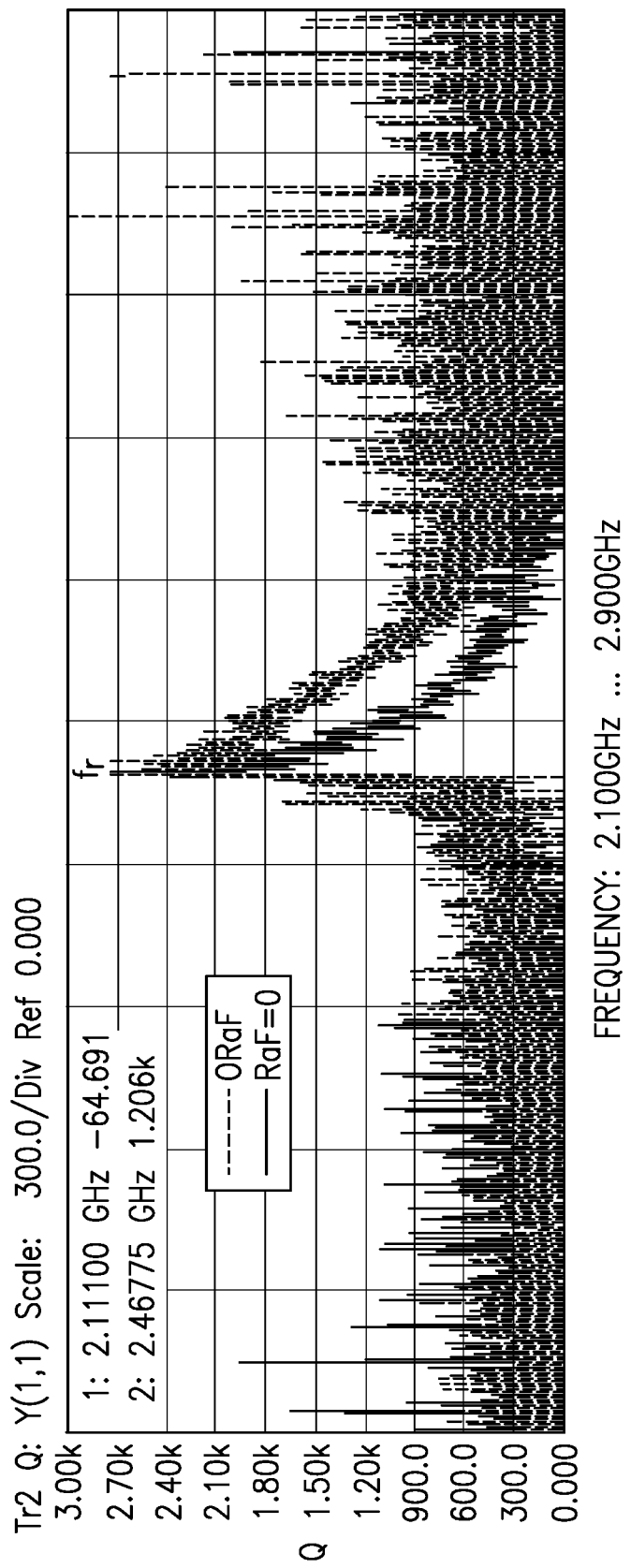
FIG. 8B is a chart illustrating a comparison of quality factor versus frequency for different film bulk acoustic resonators having either a raised frame region defined by an oxide layer or no raised frame.

The results of simulation of the quality factor Q parameters for the FBAR with raised frames formed as illustrated in FIG. 4D ("ORaF" curve) as compared to a FBAR with no raised frames ("RaF=0" curve) are illustrated in FIG. 8B. As can be observed, the FBAR with the raised frames formed from the oxide layer exhibited a quality factor above the resonance frequency that was greater than the FBAR with no raised frames. The quality factor performance of the two FBARs were approximately the same below the resonance frequency.

Figure 9A:
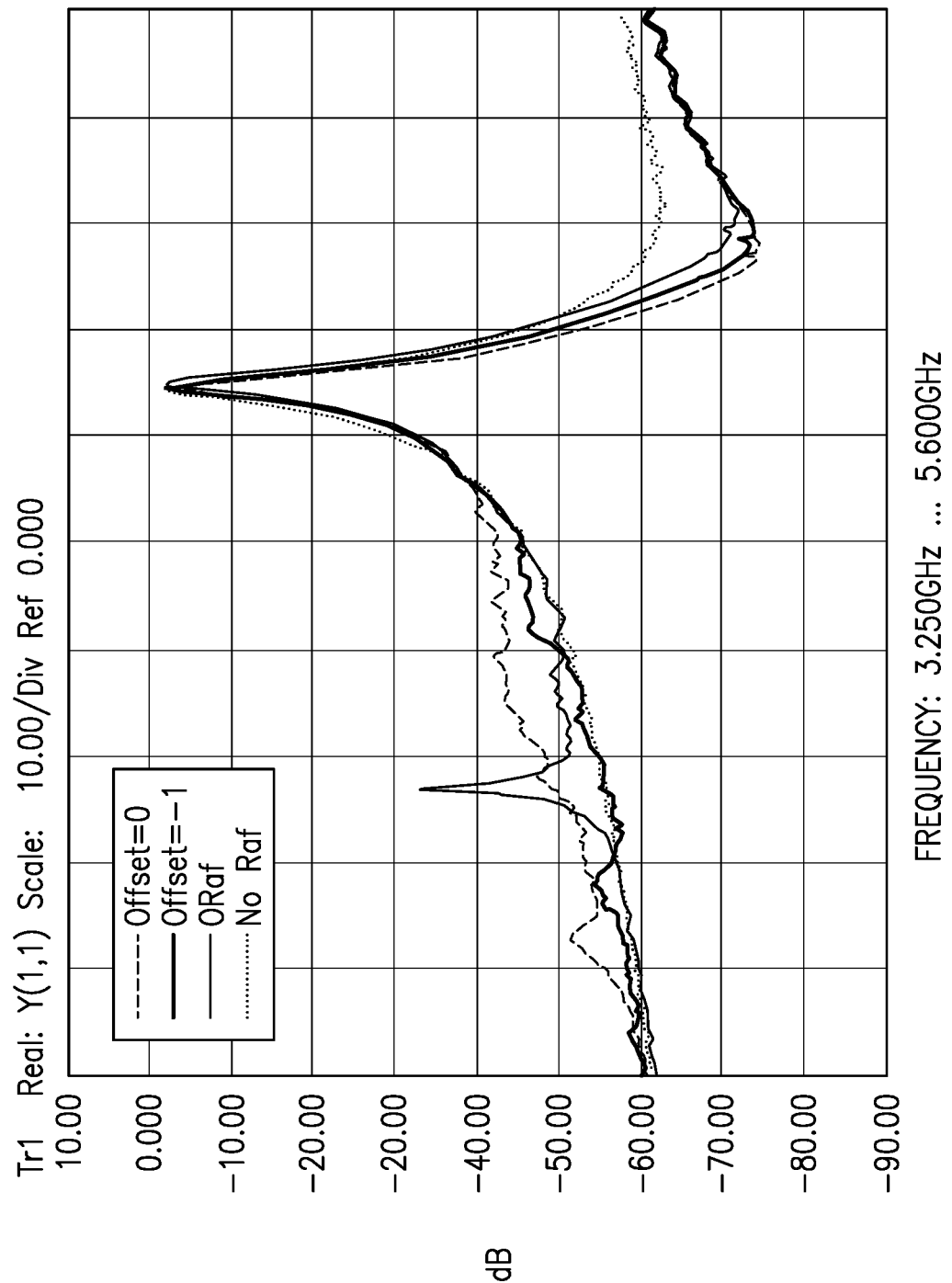
FIG. 9A is a chart illustrating a comparison of the Y11 admittance parameter versus frequency for different film bulk acoustic resonators having a first resonant frequency and different forms of raised frame structures.
Figure 9B:
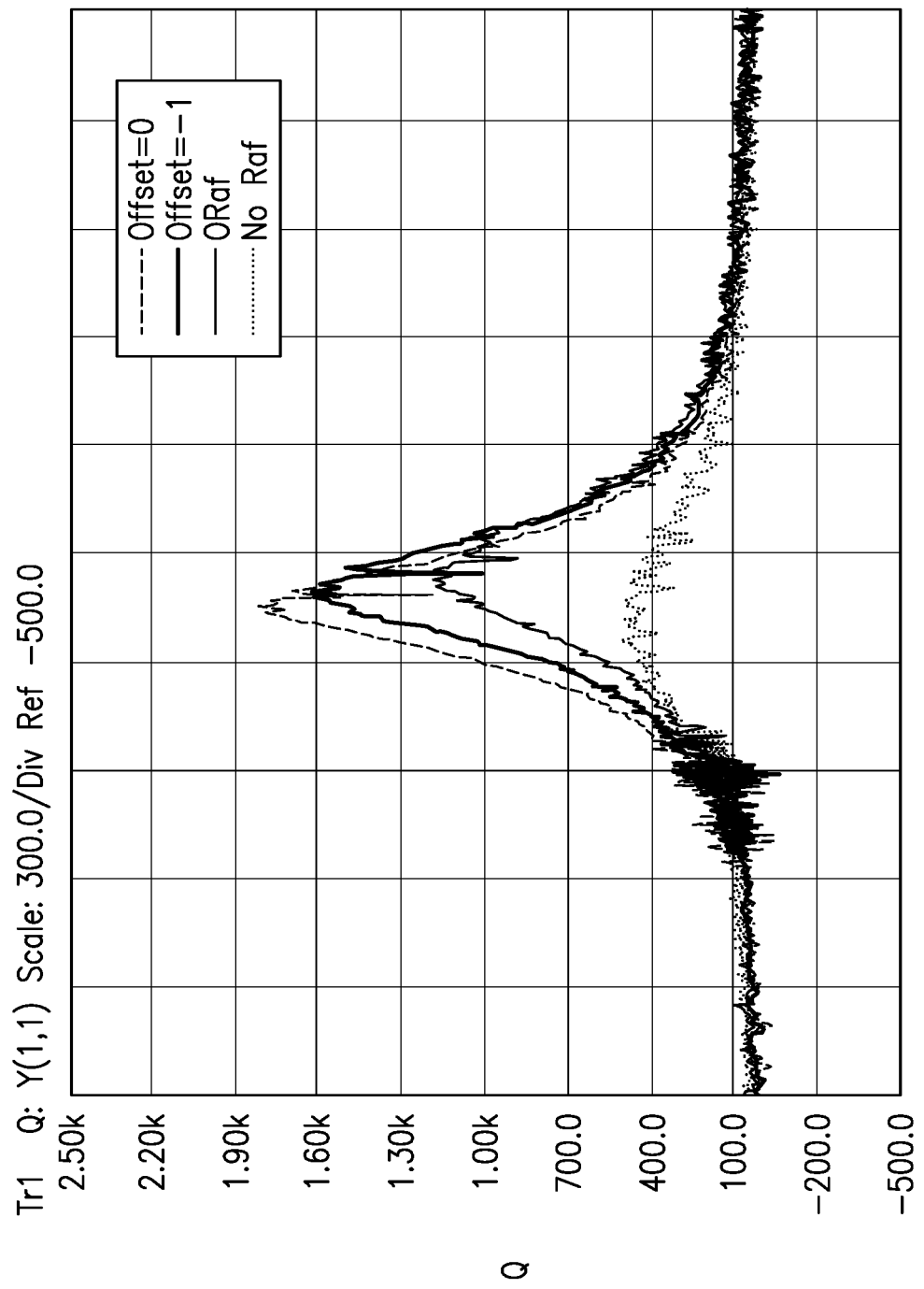
FIG. 9B is a chart illustrating a comparison of quality factor versus frequency for different film bulk acoustic resonators having a first resonant frequency and different forms of raised frame structures.
Figure 10B:
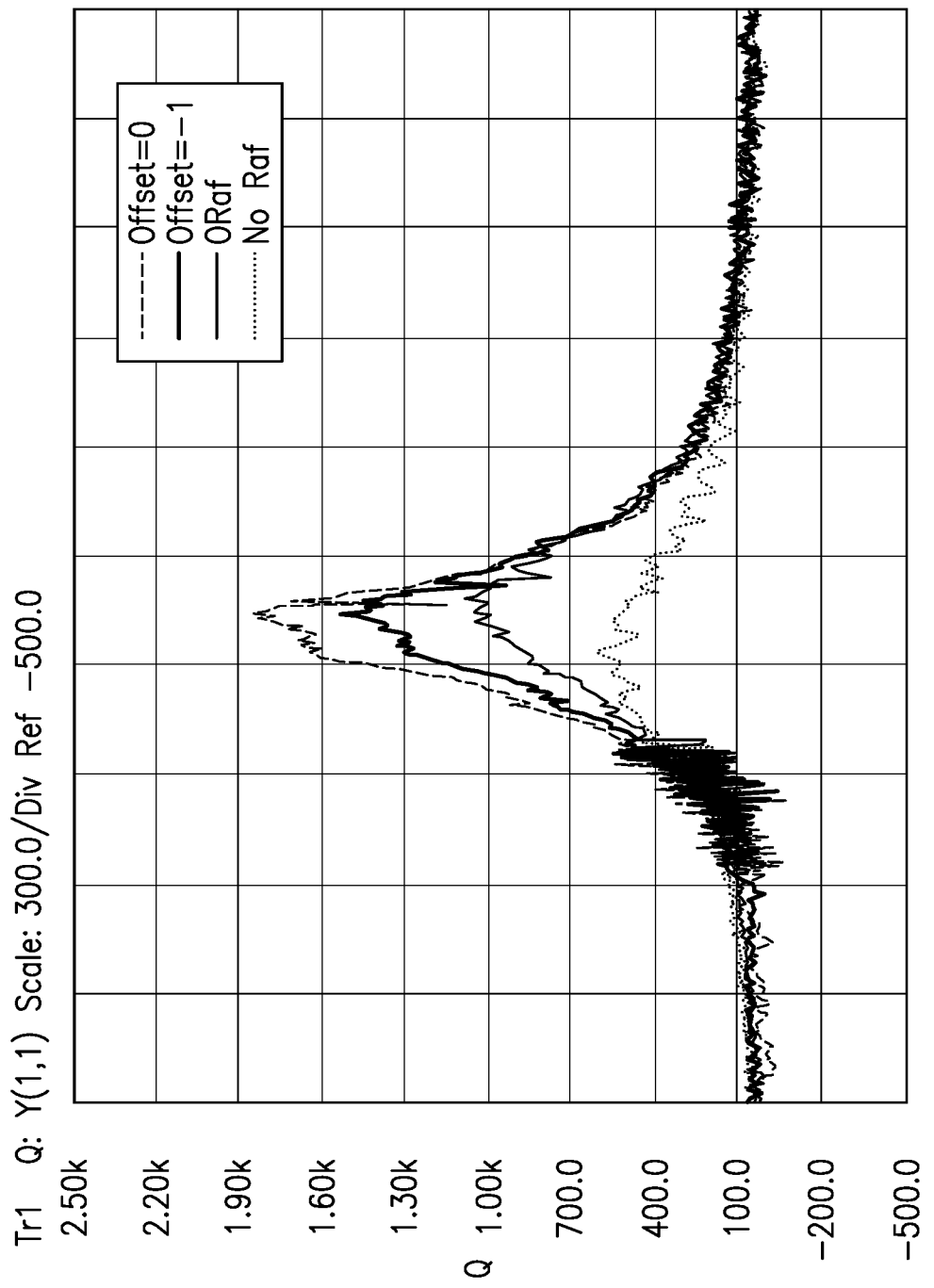
FIG. 10B is a chart illustrating a comparison of quality factor versus frequency for different film bulk acoustic resonators having a second resonant frequency and different forms of raised frame structures.

Simulations were performed to compare the Y11 conductance parameter and quality factor performances of FBARs with different raised frame structures. The results of these simulations for FBARs having a resonance frequency of about 4.8 GHz are shown in FIGS. 9A and 9B. The results of these simulations for FBARs having a resonance frequency of about 4.2 GHz are shown in FIGS. 10A and 10B. The simulated FBARs included an FBAR with raised frames formed with both an oxide layer and an additional metal layer as illustrated in FIG. 4B ("Offset=0" curves), an FBAR with raised frames formed with both an oxide layer and an additional metal layer with edges of the oxide layer and additional metal layer aligned as illustrated in FIG. 4C ("Offset=−1" curves), an FBAR with raised frames formed with an oxide layer but no additional metal layer as illustrated in FIG. 4D ("ORaF" curves), and an FBAR with no raised frames as illustrated in FIG. 7 ("No RaF" curves). For each FBAR having raised frames the raised frame width was 2.2 µm.

The FBAR with no raised frames exhibited the best Y11 parameter performance below the resonance frequency but the worst Y11 parameter performance above the resonance frequency and worst quality factor performance of all FBARs simulated. The FBAR with raised frames formed with both an oxide layer and an additional metal layer exhibited the worst Y11 parameter performance below the resonance frequency but the best Y11 parameter performance above the resonance frequency and best quality factor performance of all FBARs simulated. The other two FBARS exhibited Y11 and quality factor performances between the FBAR with no raised frames and the FBAR with raised frames formed with both an oxide layer and an additional metal layer.

Various operational parameter values that can be derived from FIGS. 9A-10B are indicated in the table below:

TABLE 1

FBAR performance comparison

| Raised Frame Type | Resonance Frequency $f_s$ | Anti-Resonance Frequency $f_p$ | Insertion Loss (IL) | Attenuation | Bandwidth ($f_p - f_s$) | Coupling factor kt2 |
|---|---|---|---|---|---|---|
| Offset = 0 | 4798.75 | 5078.75 | −0.113 | 37.675 | 280 | 12.885 |
| Offset = −1 | 4802.5 | 5108.75 | −0.119 | 37.437 | 306.25 | 13.946 |
| ORaF | 4812.5 | 5130 | −0.123 | 34.561 | 317.5 | 14.371 |
| No RaF | 4788.75 | 5128.75 | −0.12 | 23.434 | 340 | 15.328 |
| Offset = 0 | 4168.75 | 4400 | −0.106 | 41.09 | 231.25 | 12.314 |
| Offset = −1 | 4171.25 | 4421.25 | −0.097 | 37.272 | 250 | 13.198 |
| ORaF | 4190 | 4446.25 | −0.108 | 35.414 | 256.25 | 13.438 |
| No RaF | 4163.75 | 4442.5 | −0.097 | 26.277 | 278.75 | 14.558 |

From this table it can be seen that the FBAR with the raised frame including the oxide layer but no additional metal layer and the FBAR with no raised frame did not exhibit significantly better insertion loss or parameters than the FBARs with raised frames including oxide and additional metal layers. The FBAR with the raised frame including the oxide layer but no additional metal layer and the FBAR with no raised frame did, however, exhibit greater bandwidth and coupling factors than the FBARs with raised frames including oxide and additional metal layers. The FBAR with the raised frame including the oxide layer but no additional metal layer and the FBAR with no raised frame may thus be better suited for high bandwidth implementations than the other FBARs.

Figure 11A:
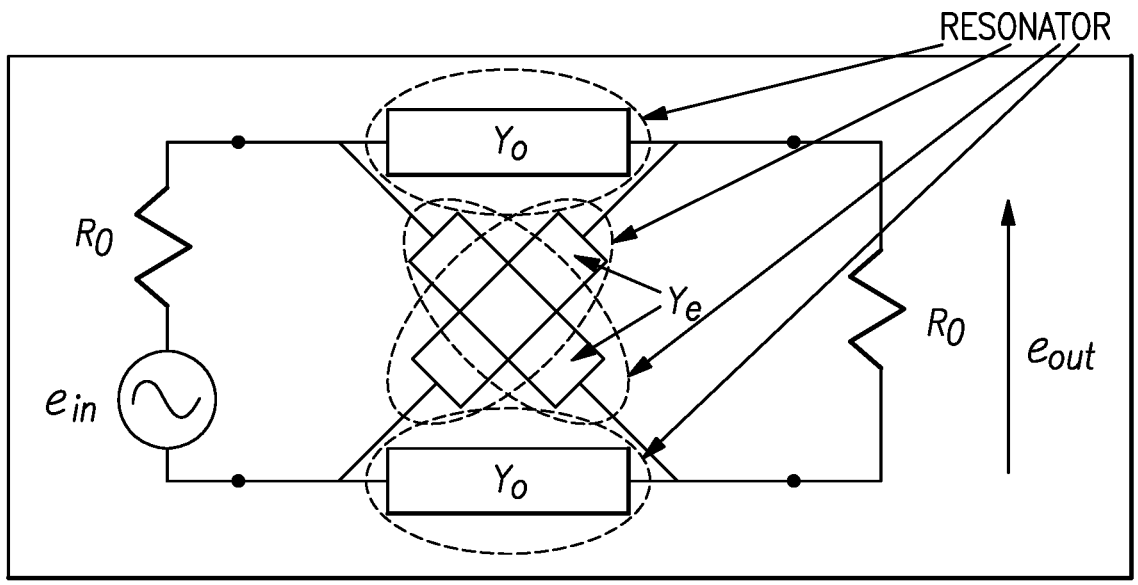
FIG. 11A illustrates an example of a lattice filter.
Figure 11B:
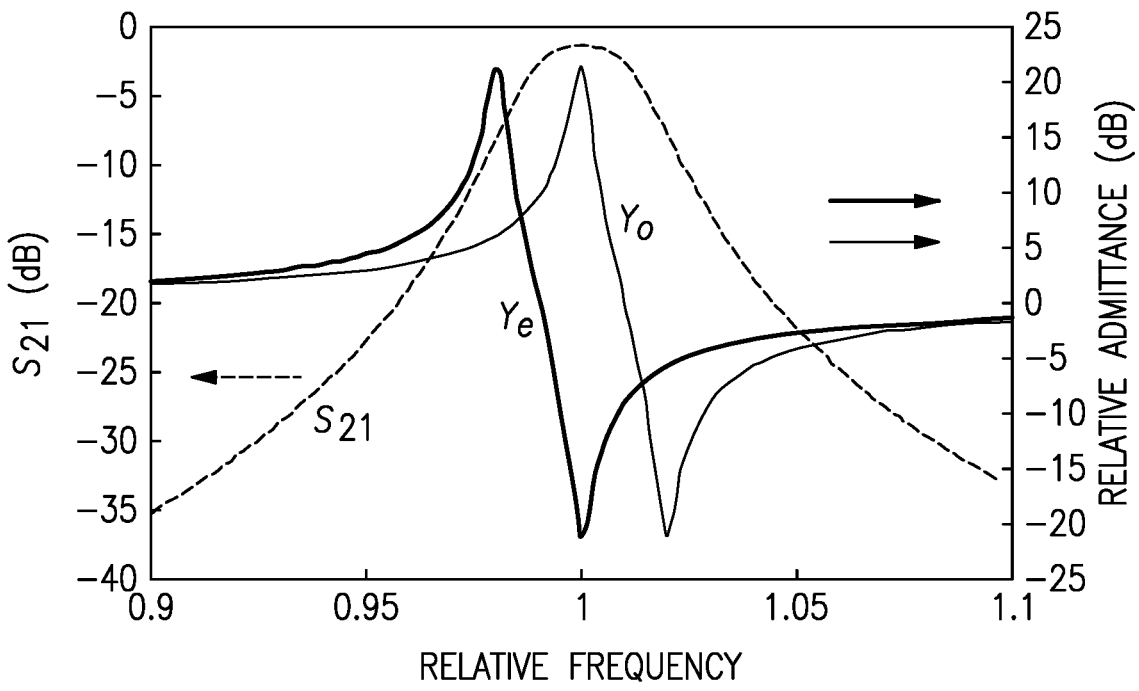
FIG. 11B illustrates frequency response of an example of lattice filter.

Resonators as disclosed herein may be utilized not only in ladder filters, but also in other forms of filters, for example, lattice filters or band rejection/notch filters. One example of a lattice filter configuration is illustrated in FIG. 11A. An example of frequency response of a lattice filter is illustrated in FIG. 11B. In examples of lattice filters or notch filters disclosed herein, each of the resonators in a filter may be formed without raised frame regions or with raised frames formed with oxide layers but no additional metal layer (for example, as illustrated in FIG. 4D) in implementations in which it is important to minimize insertion loss at the lower side of the passband. In other implementations, the parallel resonators ($Y_e$ for the lattice filter illustrated in FIG. 11A) may include raised frame regions, but one or more of the series resonators ($Y_o$ for the lattice filter illustrated in FIG. 11A) may be formed without raised frame regions or with raised frames formed with oxide layers but no additional metal layer, for example, in implementations in which it is important to minimize insertion loss at the upper side of the passband.

Figure 12A:
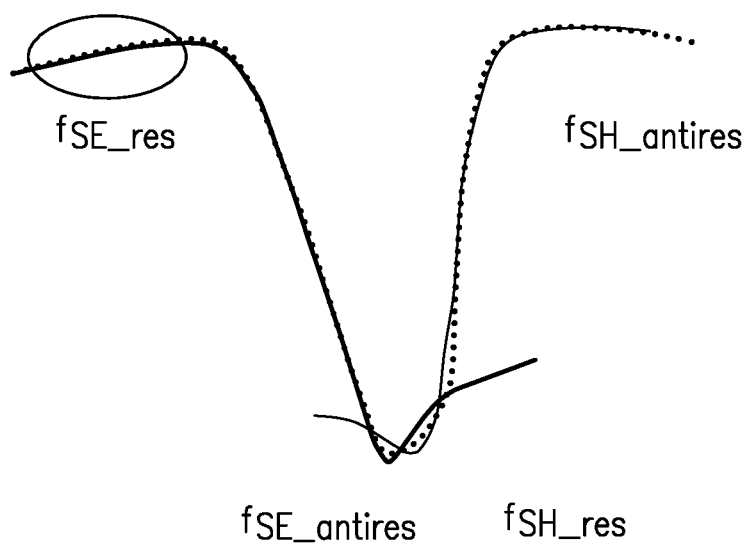
FIG. 12A illustrates the frequency response of series and shunt resonators in an example of a notch filter.
Figure 12B:
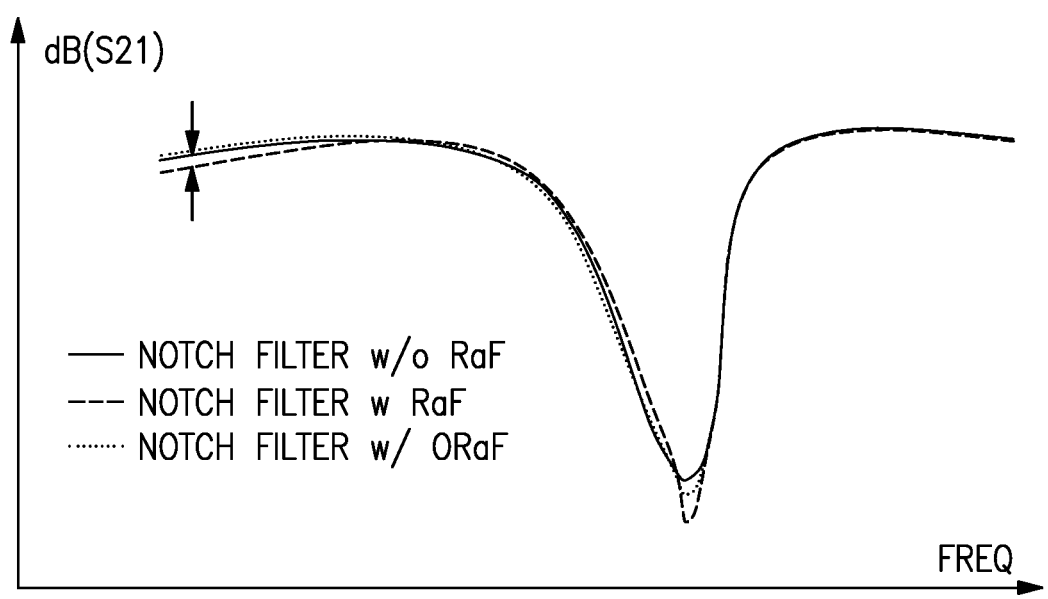
FIG. 12B illustrates the frequency response of a notch filter formed with resonators including raised frame regions as compared to the frequency response of a notch filter formed with resonators lacking raised frame regions.

The frequency response and relative locations of the resonant frequency for series resonators ($f_{SE\_res}$), anti-resonant frequency for series resonators ($f_{SE\_antires}$) resonant frequency for shunt resonators ($f_{SH\_res}$), and anti-resonant frequency for shunt resonators ($f_{SE\_antires}$) in an example of a notch filter are illustrated in FIG. 12A. A comparison between the frequency responses of a notch filter utilizing resonators with raised frame regions, without raised frame regions, or with raised frame regions defined by an oxide layer as disclosed herein is illustrated in FIG. 12B. It can be seen that a notch filter formed with resonators including raised frame regions may have a sharper notch than a notch filter formed with resonators lacking raised frame regions or with raised frame regions defined by an oxide layer as disclosed herein, but at the expense of a slightly lower admittance at frequencies below the notch.

Figure 13A:
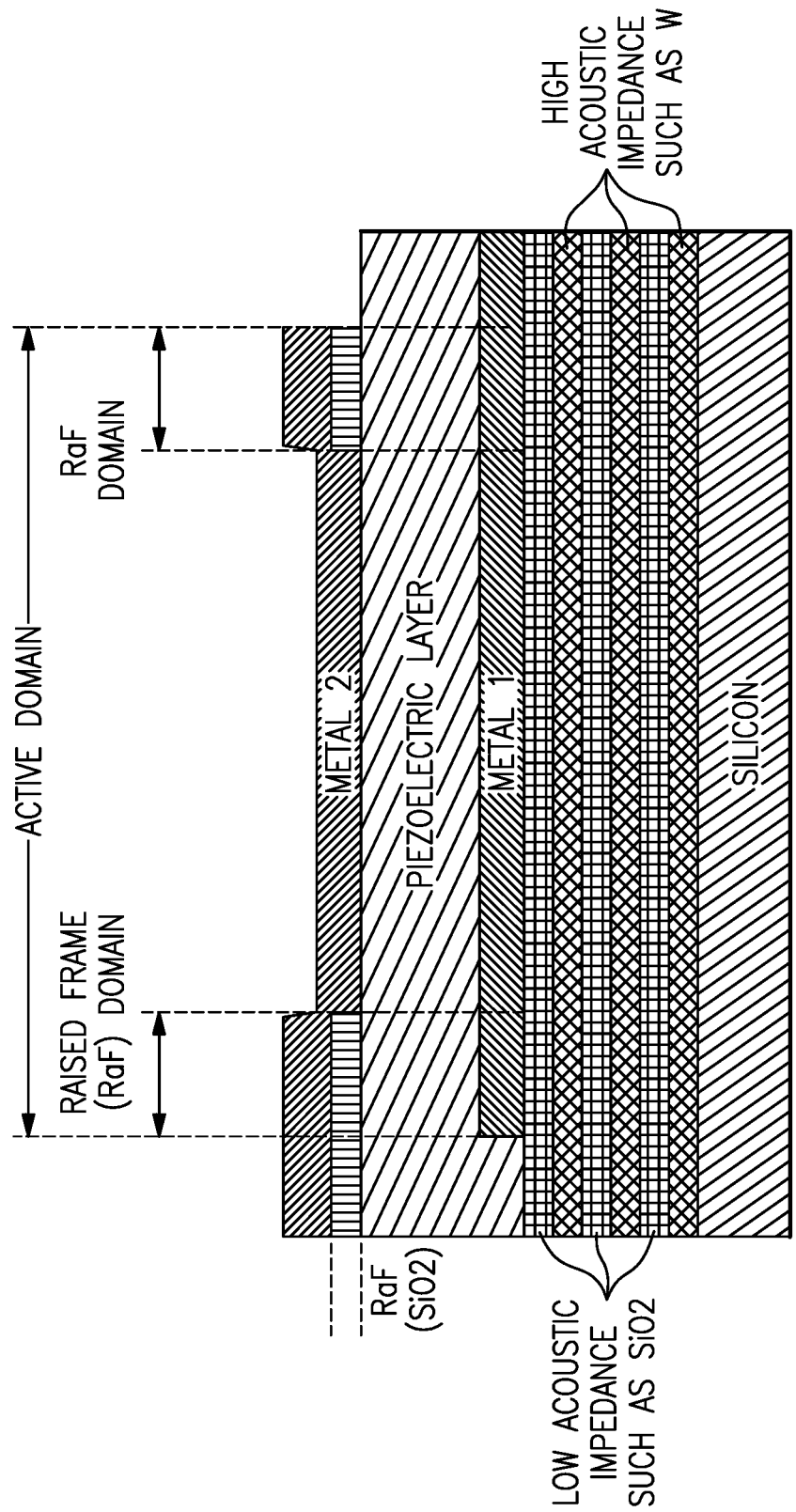
FIG. 13A is a cross-sectional view of an example of a solidly mounted resonator.
Figure 13B:
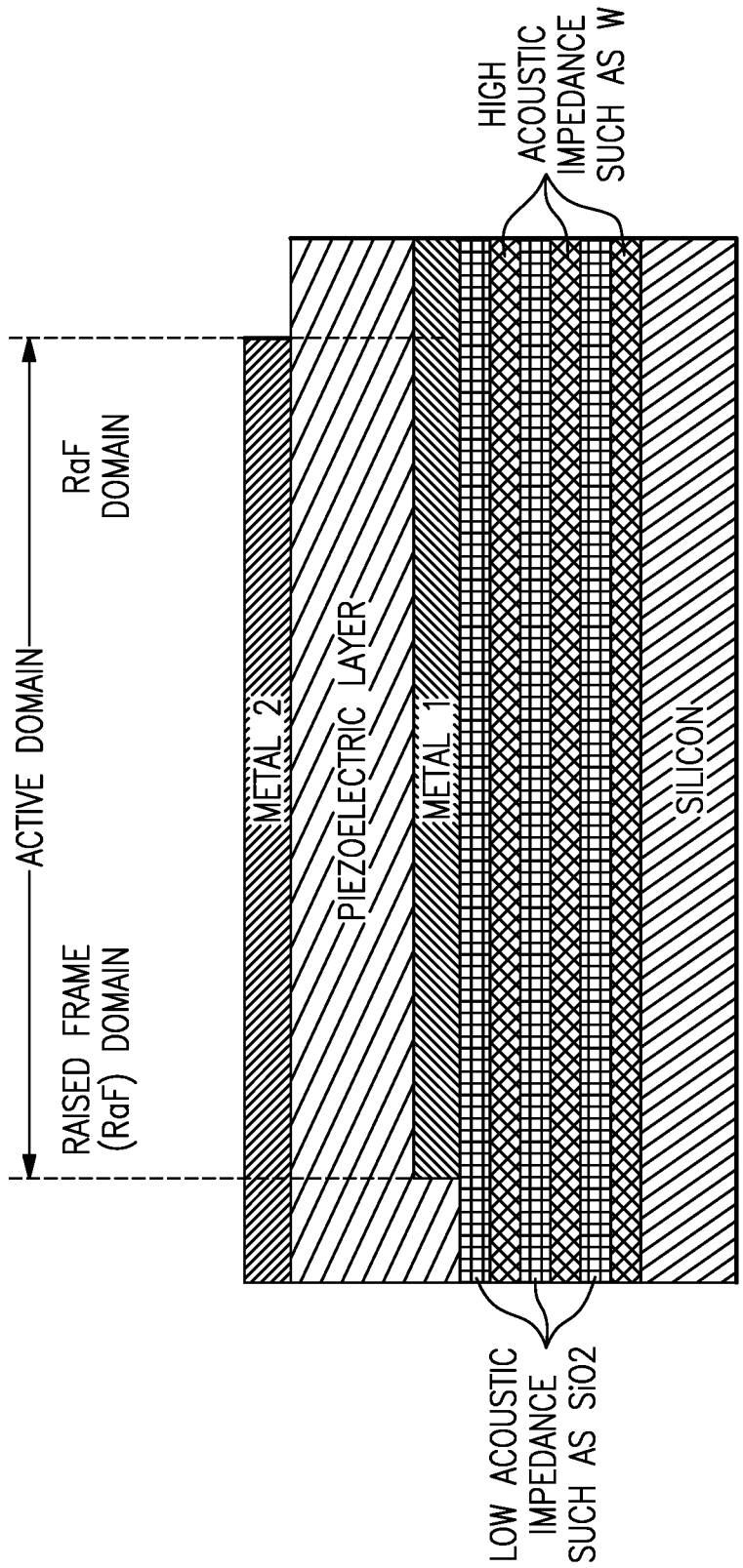
FIG. 13B is a cross-sectional view of another example of a solidly mounted resonator.

Although bulk acoustic wave resonators in the form of film bulk acoustic wave resonators have been discussed above, it is to be appreciated that aspects and embodiments of filters as disclosed herein may include one or more bulk acoustic wave resonators in the form of a solidly mounted resonator (SMR). In some embodiments, a filter, for example a radio frequency ladder filter, may include only SMRs and no FBARs or a combination of SMRs and FBARs. One or more of the SMRs as disclosed herein that may be used in a filter may include a raised frame defined by a layer of oxide below the metal layer in the raised frame region, with the metal layer in the raised frame region being no thicker or having the same thickness as the metal layer forming the electrode in the central active region. One example of such a SMR is illustrated in FIG. 13A. In other embodiments an SMR used in a filter may have a raised frame with a lesser width or height than the raised frames of other SMRs used in a filter, or no raised frame at all, for example, as illustrated in FIG. 13B. As illustrated in FIGS. 13A and 13B embodiments of SMRs disclosed herein may include a piezoelectric layer formed of, for example, aluminum nitride or another suitable piezoelectric material, an upper electrode (the metal 2 layer in FIGS. 13A and 13B) disposed on an upper surface of the piezoelectric layer, and a lower electrode (the metal 1 layer in FIGS. 13A and 13B) disposed on lower surface of the piezoelectric layer. The piezoelectric layer and upper and lower electrodes may be disposed on a Bragg reflector formed of alternating layers of a first material with a high acoustic impedance, for example, tungsten, and a second material with a lower acoustic impedance than the first material, for example, $SiO_2$. The Bragg reflector may be mounted on a substrate, for example, a silicon substrate. In SMRs including a raised frame, the raised frame may include a layer of a dielectric material, for example, $SiO_2$ (the RaF layer illustrated in FIG. 13A) disposed between the lower surface of the upper electrode and the piezoelectric material in a raised frame domain region of the resonator.

Figure 14:
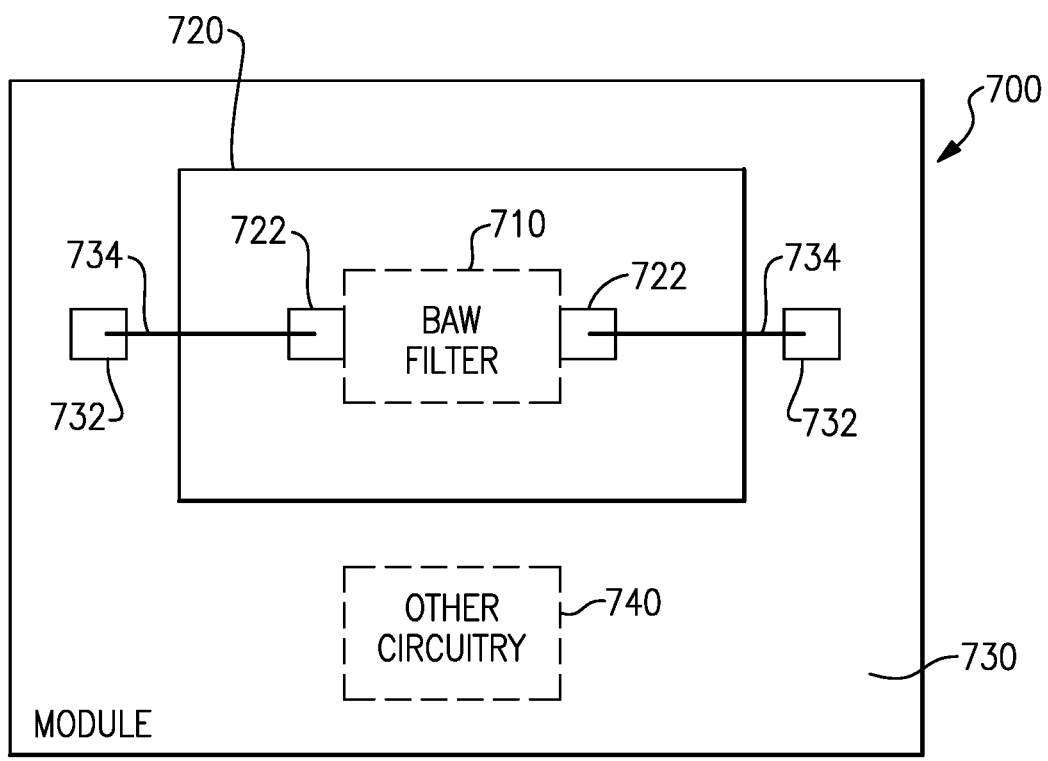
FIG. 14 is a block diagram of one example of a filter module that can include one or more acoustic wave elements according to aspects of the present disclosure.
Figure 15:
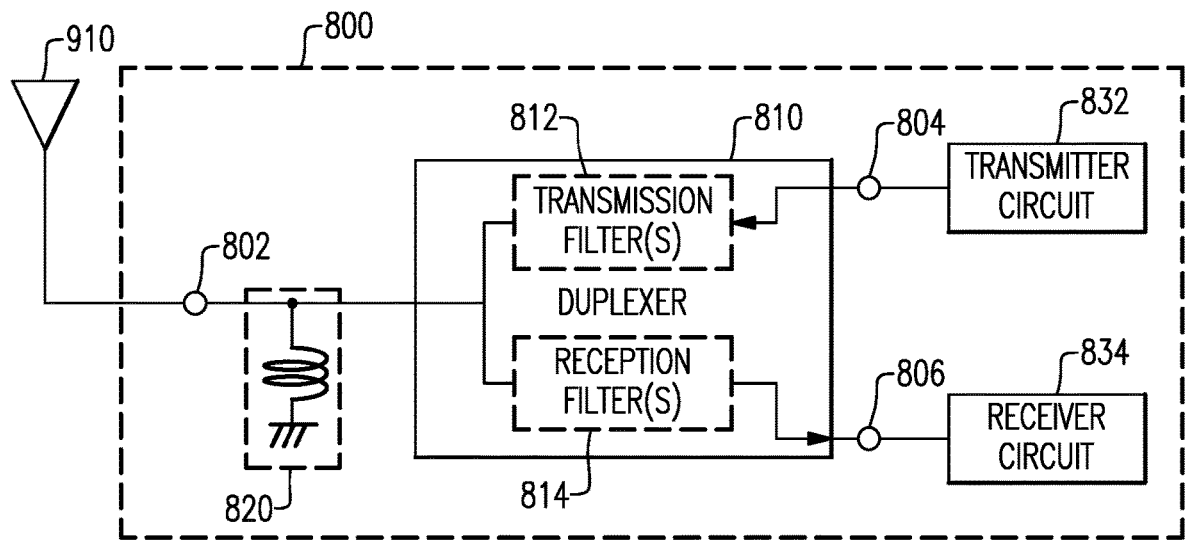
FIG. 15 is a block diagram of one example of a front-end module that can include one or more filter modules according to aspects of the present disclosure.
Figure 16:
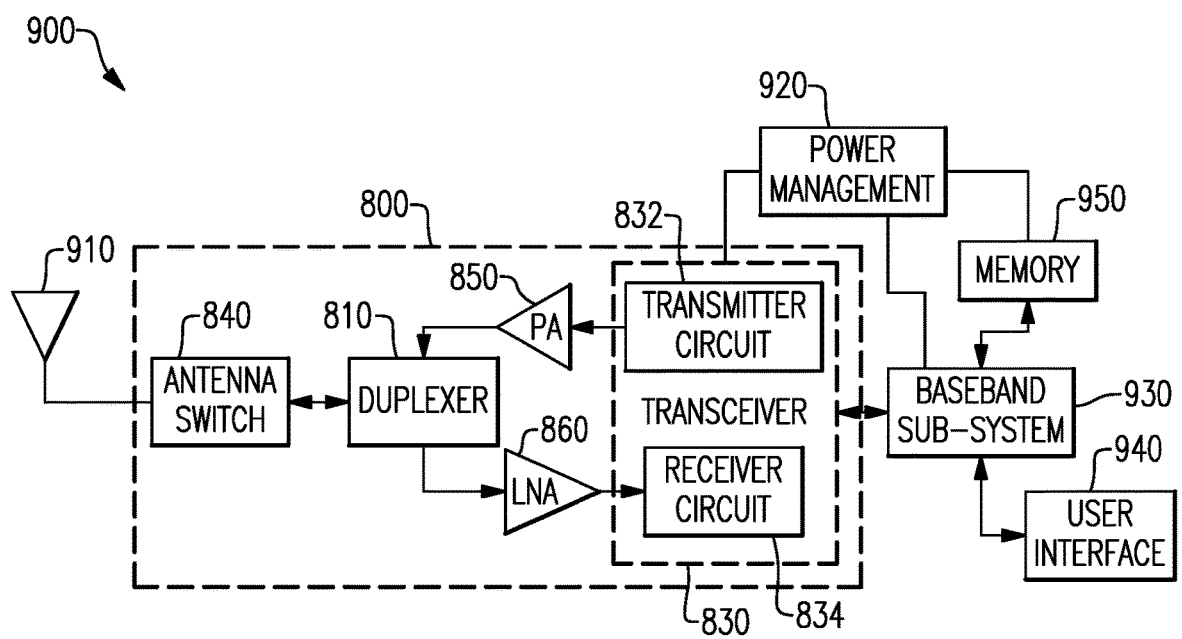
FIG. 16 is a block diagram of one example of a wireless device including the front-end module of FIG. 15.

The acoustic wave devices discussed herein can be implemented in a variety of packaged modules. Some example packaged modules will now be discussed in which any suitable principles and advantages of the packaged acoustic wave devices discussed herein can be implemented. FIGS. 14, 15, and 16 are schematic block diagrams of illustrative packaged modules and devices according to certain embodiments.

As discussed above, embodiments of the disclosed BAW resonators can be configured as or used in filters, for example. In turn, a BAW filter using one or more BAW resonator elements may be incorporated into and packaged as a module that may ultimately be used in an electronic device, such as a wireless communications device, for example. FIG. 14 is a block diagram illustrating one example of a module 700 including a BAW filter 710. The BAW filter 710 may be implemented on one or more die(s) 720 including one or more connection pads 722. For example, the BAW filter 710 may include a connection pad 722 that corresponds to an input contact for the BAW filter and another connection pad 722 that corresponds to an output contact for the BAW filter. The packaged module 700 includes a packaging substrate 730 that is configured to receive a plurality of components, including the die 720. A plurality of connection pads 732 can be disposed on the packaging substrate 730, and the various connection pads 722 of the BAW filter die 720 can be connected to the connection pads 732 on the packaging substrate 730 via electrical connectors 734, which can be solder bumps or wirebonds, for example, to allow for passing of various signals to and from the BAW filter 710. The module 700 may optionally further include other circuitry die 740, such as, for example one or more additional filter(s), amplifiers, pre-filters, modulators, demodulators, down converters, and the like, as would be known to one of skill in the art of semiconductor fabrication in view of the disclosure herein. In some embodiments, the module 700 can also include one or more packaging structures to, for example, provide protection and facilitate easier handling of the module 700. Such a packaging structure can include an overmold formed over the packaging substrate 730 and dimensioned to substantially encapsulate the various circuits and components thereon.

Various examples and embodiments of the BAW filter 710 can be used in a wide variety of electronic devices. For example, the BAW filter 710 can be used in an antenna duplexer, which itself can be incorporated into a variety of electronic devices, such as RF front-end modules and communication devices.

Referring to FIG. 15, there is illustrated a block diagram of one example of a front-end module 800, which may be used in an electronic device such as a wireless communications device (e.g., a mobile phone) for example. The front-end module 800 includes an antenna duplexer 810 having a common node 802, an input node 804, and an output node 806. An antenna 910 is connected to the common node 802.

The antenna duplexer 810 may include one or more transmission filters 812 connected between the input node 804 and the common node 802, and one or more reception filters 814 connected between the common node 802 and the output node 806. The passband(s) of the transmission filter(s) are different from the passband(s) of the reception filters. Examples of the BAW filter 710 can be used to form the transmission filter(s) 812 and/or the reception filter(s) 814. An inductor or other matching component 820 may be connected at the common node 802.

The front-end module 800 further includes a transmitter circuit 832 connected to the input node 804 of the duplexer 810 and a receiver circuit 834 connected to the output node 806 of the duplexer 810. The transmitter circuit 832 can generate signals for transmission via the antenna 910, and the receiver circuit 834 can receive and process signals received via the antenna 910. In some embodiments, the receiver and transmitter circuits are implemented as separate components, as shown in FIG. 15, however in other embodiments these components may be integrated into a common transceiver circuit or module. As will be appreciated by those skilled in the art, the front-end module 800 may include other components that are not illustrated in FIG. 15 including, but not limited to, switches, electromagnetic couplers, amplifiers, processors, and the like.

FIG. 16 is a block diagram of one example of a wireless device 900 including the antenna duplexer 810 shown in FIG. 15. The wireless device 900 can be a cellular phone, smart phone, tablet, modem, communication network or any other portable or non-portable device configured for voice or data communication. The wireless device 900 can receive and transmit signals from the antenna 910. The wireless device includes an embodiment of a front-end module 800 similar to that discussed above with reference to FIG. 15. The front-end module 800 includes the duplexer 810, as discussed above. In the example shown in FIG. 16 the front-end module 800 further includes an antenna switch 840, which can be configured to switch between different frequency bands or modes, such as transmit and receive modes, for example. In the example illustrated in FIG. 16, the antenna switch 840 is positioned between the duplexer 810 and the antenna 910; however, in other examples the duplexer 810 can be positioned between the antenna switch 840 and the antenna 910. In other examples the antenna switch 840 and the duplexer 810 can be integrated into a single component.

The front-end module 800 includes a transceiver 830 that is configured to generate signals for transmission or to process received signals. The transceiver 830 can include the transmitter circuit 832, which can be connected to the input node 804 of the duplexer 810, and the receiver circuit 834, which can be connected to the output node 806 of the duplexer 810, as shown in the example of FIG. 15.

Signals generated for transmission by the transmitter circuit 832 are received by a power amplifier (PA) module 850, which amplifies the generated signals from the transceiver 830. The power amplifier module 850 can include one or more power amplifiers. The power amplifier module 850 can be used to amplify a wide variety of RF or other frequency-band transmission signals. For example, the power amplifier module 850 can receive an enable signal that can be used to pulse the output of the power amplifier to aid in transmitting a wireless local area network (WLAN) signal or any other suitable pulsed signal. The power amplifier module 850 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 850 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 16, the front-end module 800 may further include a low noise amplifier module 860, which amplifies received signals from the antenna 910 and provides the amplified signals to the receiver circuit 834 of the transceiver 830.

The wireless device 900 of FIG. 16 further includes a power management sub-system 920 that is connected to the transceiver 830 and manages the power for the operation of the wireless device 900. The power management system 920 can also control the operation of a baseband sub-system 930 and various other components of the wireless device 900. The power management system 920 can include, or can be connected to, a battery (not shown) that supplies power for the various components of the wireless device 900. The power management system 920 can further include one or more processors or controllers that can control the transmission of signals, for example. In one embodiment, the baseband sub-system 930 is connected to a user interface 940 to facilitate various input and output of voice and/or data provided to and received from the user. The baseband sub-system 930 can also be connected to memory 950 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A ladder filter comprising:
an input port and an output port;
a plurality of series arm bulk acoustic wave resonators electrically connected in series between the input port and the output port; and
a plurality of shunt bulk acoustic wave resonators electrically connected between respective adjacent ones of the plurality of series arm bulk acoustic wave resonators and ground, each of the plurality of series arm bulk acoustic wave resonators and the plurality of shunt bulk acoustic wave resonators including a central active region and a raised frame region outside of the central active region, each of the plurality of series arm bulk acoustic wave resonators and the plurality of shunt bulk acoustic wave resonators including a piezoelectric film and an upper electrode disposed on an upper surface of the piezoelectric film, at least one of the plurality of series arm bulk acoustic wave resonators including a layer of oxide disposed directly on the piezoelectric film in the raised frame region, and a metal layer disposed directly on only a portion of the upper electrode in only a portion of the central active region and disposed on the layer of oxide in the raised frame region, the metal layer having a thickness in the raised frame region that is no greater than the thickness of the metal layer in the only the portion of the central active region to reduce spurious mode signals in the at least one of the plurality of series arm bulk acoustic wave resonators.

2. The ladder filter of claim 1 wherein the plurality of series arm bulk acoustic wave resonators are each film bulk acoustic wave resonators.

3. The ladder filter of claim 2 wherein the plurality of shunt bulk acoustic wave resonators are each film bulk acoustic wave resonators.

4. The ladder filter of claim 3 wherein each of the plurality of series arm film bulk acoustic wave resonators and each of the plurality of shunt film bulk acoustic wave resonators include the piezoelectric film disposed in the central active region, and in a recessed frame region circumscribing the central region, the central active region defining a main active domain in which a main acoustic wave is generated during operation.

5. The ladder filter of claim 4 wherein each of the plurality of shunt film bulk acoustic wave resonators include the raised frame region disposed on opposite sides of the recessed frame region from the central active region.

6. The ladder filter of claim 5 wherein the raised frame regions of each of the plurality of shunt film bulk acoustic wave resonators have approximately a same width.

7. The ladder filter of claim 5 wherein at least one of the plurality of shunt film bulk acoustic wave resonators has the raised frame region with a width less than a width of the raised frame region of another of the plurality of shunt film bulk acoustic wave resonators.

8. The ladder filter of claim 3 wherein each of the plurality of series arm film bulk acoustic wave resonators includes the layer of oxide disposed directly on the piezoelectric film in the raised frame region, and the metal layer disposed directly on the only the portion of the upper electrode in the only the portion of the central active region and disposed on the oxide layer in the raised frame region, the thickness of the metal layer in the raised frame region being no greater than the thickness of the metal layer in the only the portion of the central active region.

9. The ladder filter of claim 3 wherein each of the plurality of series arm film bulk acoustic wave resonators has a same resonant frequency.

10. The ladder filter of claim 9 wherein each of the plurality of shunt film bulk acoustic wave resonators has a resonant frequency below the resonant frequency of each of the plurality of series arm film bulk acoustic wave resonators.

11. The ladder filter of claim 10 wherein at least one of the plurality of shunt film bulk acoustic wave resonators has a first resonant frequency different from resonant frequencies of others of the plurality of shunt film bulk acoustic wave resonators.

12. The ladder filter of claim 11 wherein at least one of the plurality of shunt film bulk acoustic wave resonators has a second resonant frequency different from the first resonant frequency and different from the resonant frequencies of others of the plurality of shunt film bulk acoustic wave resonators.

13. The ladder filter of claim 1 wherein the ladder filter exhibits a greater insertion loss at an upper end of a passband of the ladder filter than at a lower end of the passband of the ladder filter.

14. The ladder filter of claim 1 wherein the ladder filter has a passband in a radio frequency band.

15. The ladder filter of claim 13 wherein the passband is greater than about 200 MHz in width.

16. The ladder filter of claim 13 wherein the ladder filter exhibits a relative passband width wider than 5.5%, the relative passband width being defined as a bandwidth of the ladder filter divided by a center frequency of the ladder filter.

17. The ladder filter of claim 1 wherein the plurality of series arm bulk acoustic wave resonators includes at least one solidly mounted resonator.

18. The ladder filter of claim 17 wherein the plurality of shunt bulk acoustic wave resonators includes at least one solidly mounted resonator.

19. An electronics module including the ladder filter of claim 1.

20. An electronic device comprising an electronics module including the ladder filter of claim 1.

21. A film bulk acoustic wave resonator comprising:
a piezoelectric film disposed in a central region defining a main active domain in which a main acoustic wave is generated during operation, and in a raised frame region circumscribing the central region;

an upper electrode disposed on an upper surface of the piezoelectric film in the central region;

a layer of oxide disposed directly on the piezoelectric film in the raised frame region; and a metal layer disposed directly on only a portion of the upper electrode in only a portion of the central region and disposed on the layer of oxide in the raised frame region, the metal layer having a thickness in the raised frame region no greater than the thickness of the metal layer in the only the portion of the central region.

22. A radio frequency filter including the film bulk acoustic wave resonator of claim 21.

23. An electronics module comprising a radio frequency filter including the film bulk acoustic wave resonator of claim 21.

* * * * *